(12) United States Patent
Miwa et al.

(10) Patent No.: US 9,276,504 B2
(45) Date of Patent: Mar. 1, 2016

(54) CARRIER DEVICE AND CERAMIC MEMBER

(71) Applicant: NGK SPARK PLUG CO., LTD., Nagoya, Aichi (JP)

(72) Inventors: Kaname Miwa, Komaki (JP); Tomonori Niwa, Ichinomiya (JP); Jun Kurano, Kiyosu (JP)

(73) Assignee: NGK SPARK PLUG CO., LTD., Aichi (JP)

( * ) Notice: Subject to any disclaimer, the term of this patent is extended or adjusted under 35 U.S.C. 154(b) by 0 days.

(21) Appl. No.: 14/383,301

(22) PCT Filed: Feb. 28, 2013

(86) PCT No.: PCT/JP2013/001244
§ 371 (c)(1),
(2) Date: Sep. 5, 2014

(87) PCT Pub. No.: WO2013/132803
PCT Pub. Date: Sep. 12, 2013

(65) Prior Publication Data
US 2015/0021944 A1    Jan. 22, 2015

(30) Foreign Application Priority Data

Mar. 7, 2012  (JP) ................................ 2012-050209

(51) Int. Cl.
*H01L 21/683*   (2006.01)
*H02N 13/00*   (2006.01)
(Continued)

(52) U.S. Cl.
CPC ............. *H02N 13/00* (2013.01); *B25J 11/0095* (2013.01); *B25J 15/0014* (2013.01);
(Continued)

(58) Field of Classification Search
CPC ............... B25J 15/0014; B25J 15/0616; B25J 15/0085; B25J 11/0095; H01L 21/67742; H01L 21/67103; H01L 21/6833; H02N 13/00
USPC .......................................... 294/213; 414/941
See application file for complete search history.

(56) References Cited

U.S. PATENT DOCUMENTS 5,191,506 A * 3/1993 Logan et al. ................... 361/234
5,909,355 A * 6/1999 Parkhe ........................... 361/234
(Continued)

FOREIGN PATENT DOCUMENTS

JP    4-37047 A    2/1992
JP    9-213455 A   8/1997
(Continued)

OTHER PUBLICATIONS

International Search Report for PCT/JP2013/001244 dated May 14, 2013.

*Primary Examiner* — Dean Kramer
(74) *Attorney, Agent, or Firm* — Sughrue Mion, PLLC

(57) ABSTRACT

A ceramic member, in a carrier device, includes: a plurality of ceramic layers that have insulating properties and are integrally sintered; a clamping electrode formed on a first ceramic layer among the plurality of ceramic layers and inside of the plurality of ceramic layers, and configured to attract a dielectric material by electrostatic force; a power feed port configured to receive a supply of electric power to the clamping electrode from outside of the ceramic member; a land formed on a second ceramic layer, which is different from the first ceramic layer among the plurality of ceramic layers, and configured to receive electric power through the power feed port; and a via arranged to pass through at least one of the plurality of ceramic layers and provided as a conductive material to electrically connect the clamping electrode with the land.

6 Claims, 29 Drawing Sheets

(51) Int. Cl.
  *B25J 11/00*  (2006.01)
  *H01L 21/67*  (2006.01)
  *H01L 21/677* (2006.01)
  *B25J 15/00*  (2006.01)
  *B25J 15/06*  (2006.01)

(52) U.S. Cl.
  CPC .......... *B25J15/0085* (2013.01); *B25J 15/0616* (2013.01); *H01L 21/67103* (2013.01); *H01L 21/67742* (2013.01); *H01L 21/6833* (2013.01)

(56) References Cited

U.S. PATENT DOCUMENTS 6,255,601 B1    7/2001  Burkhart
6,303,879 B1   10/2001  Burkhart
6,483,690 B1 * 11/2002  Nakajima et al. ............. 361/234
6,768,627 B1 *  7/2004  Kitabayashi et al. ......... 361/234
2010/0104403 A1 *  4/2010  Cho et al. ................. 414/222.13

FOREIGN PATENT DOCUMENTS

| JP | 9-223729 A | 8/1997 |
| JP | 10-242256 A | 9/1998 |
| JP | 10-326823 A | 12/1998 |
| JP | 2005-197391 A | 7/2005 |
| JP | 2007-53405 A | 3/2007 |
| JP | 2009-202240 A | 9/2009 |
| JP | 2011-77288 A | 4/2011 |

* cited by examiner

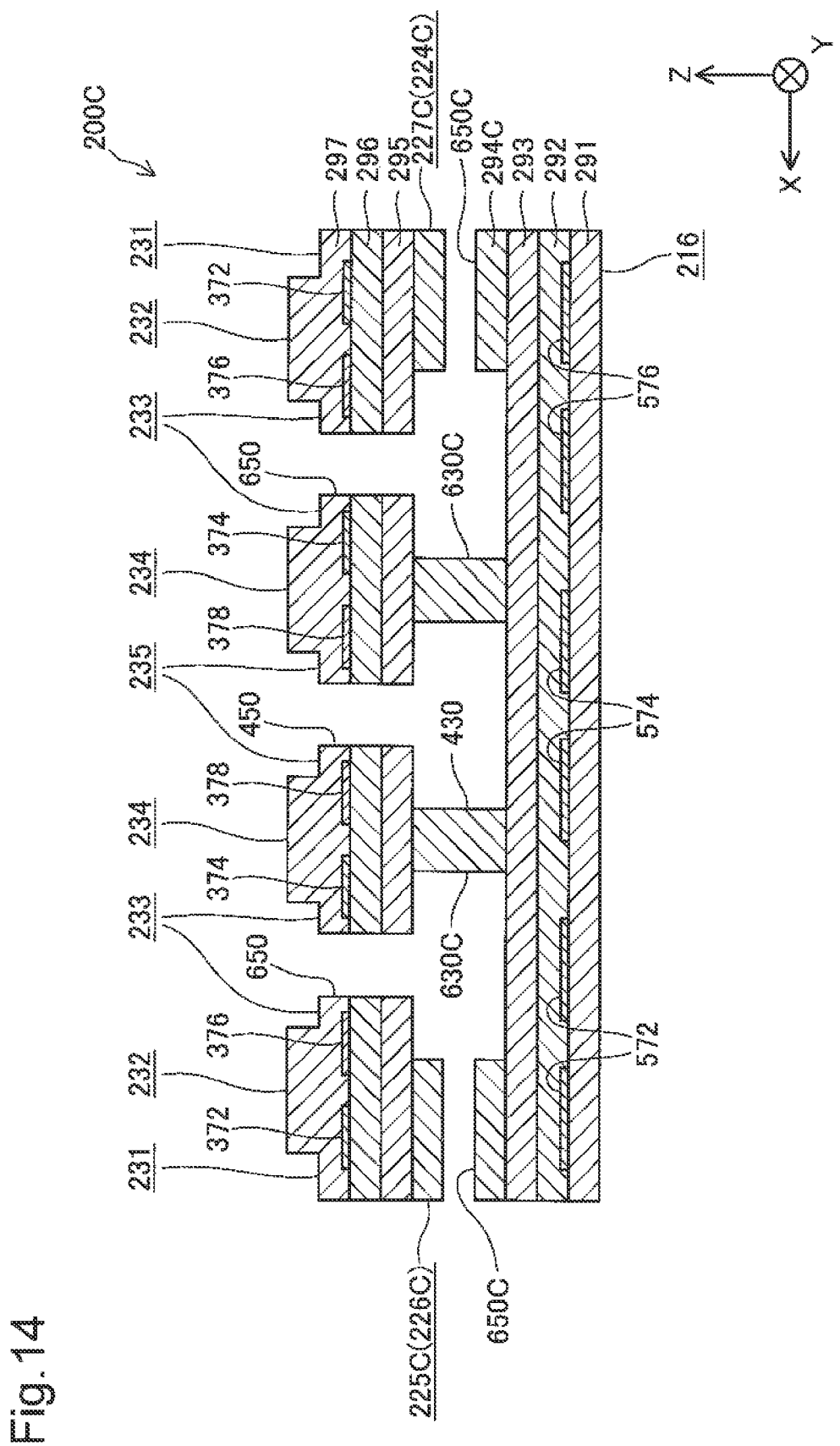

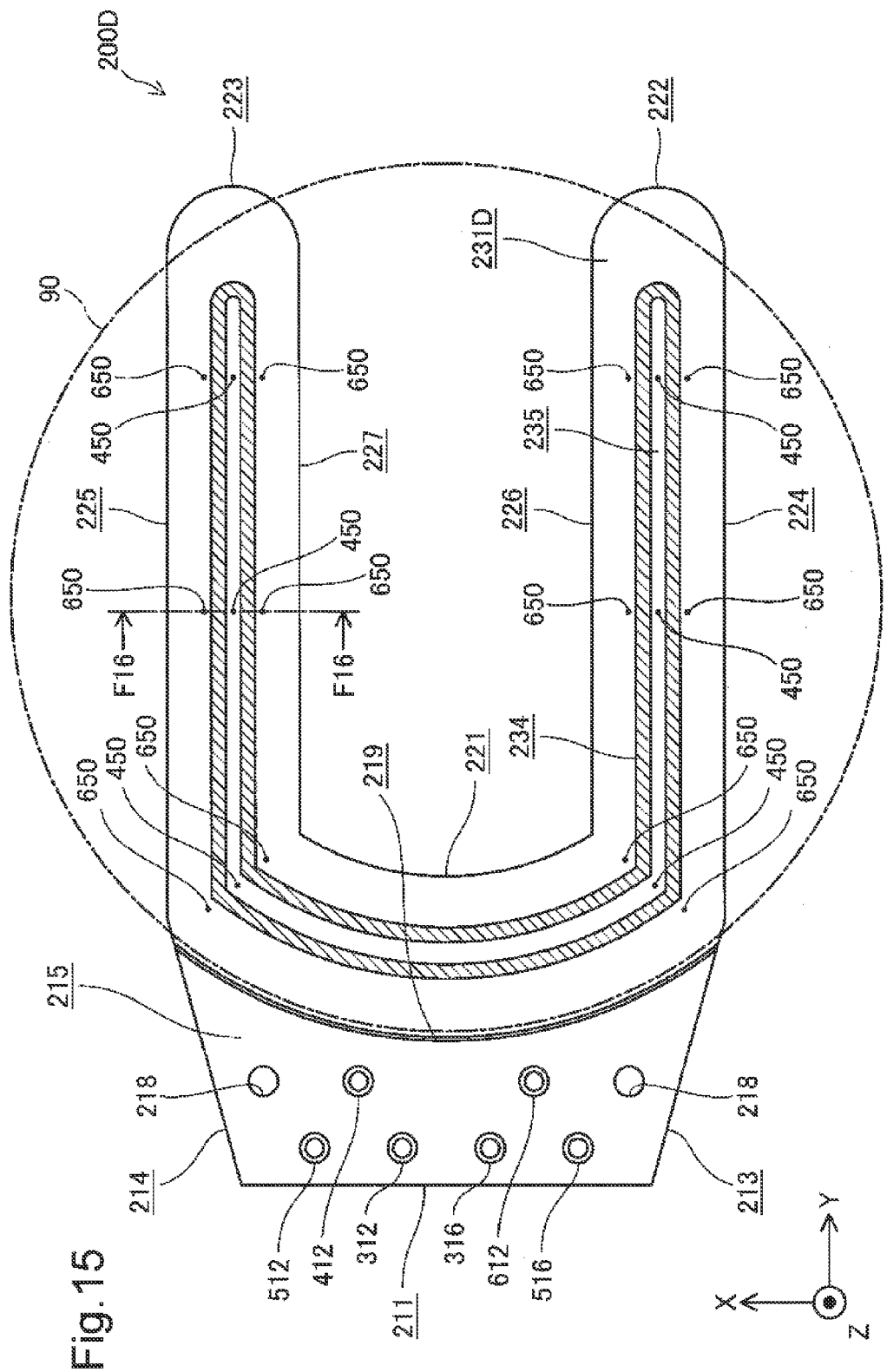

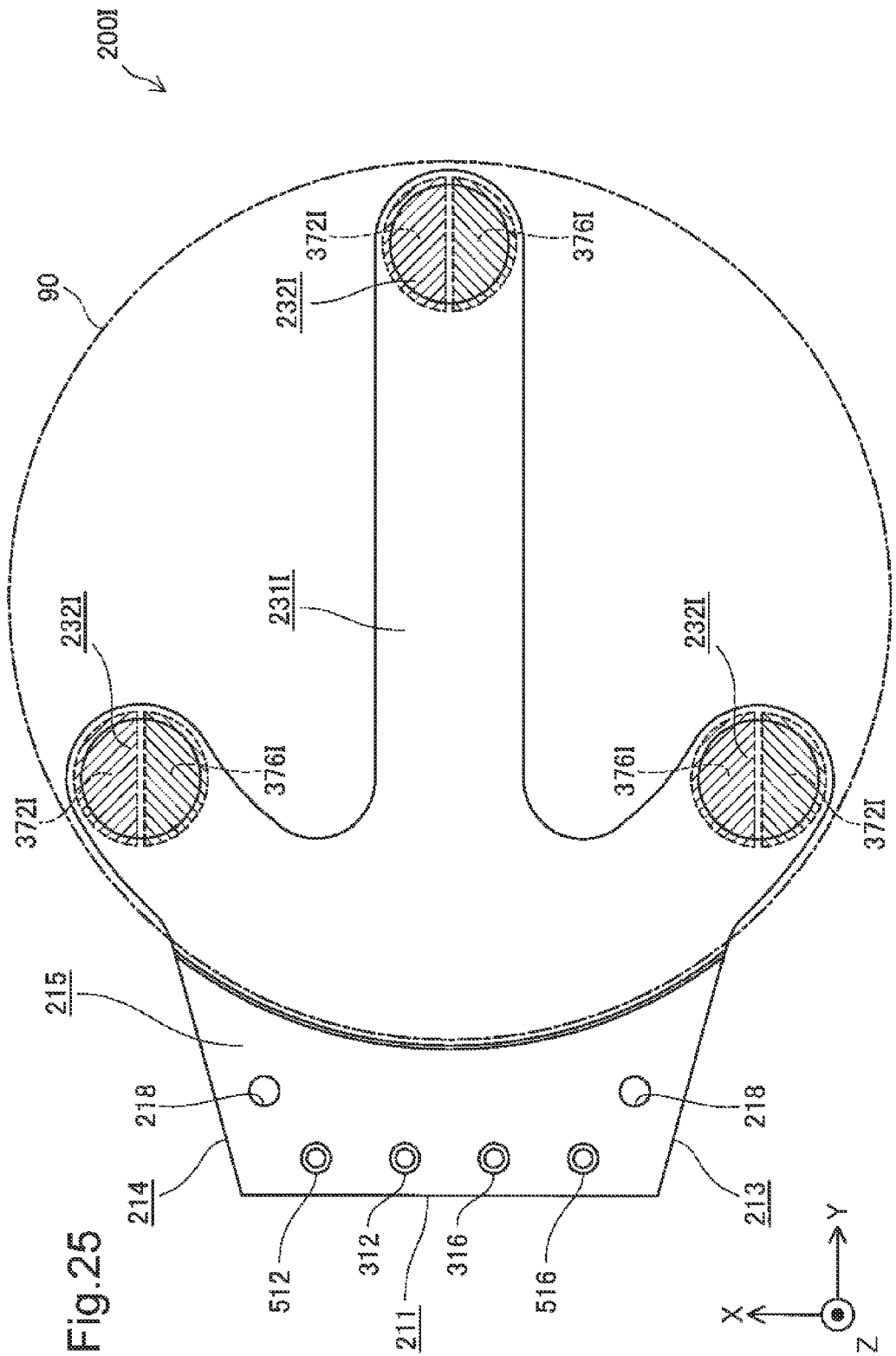

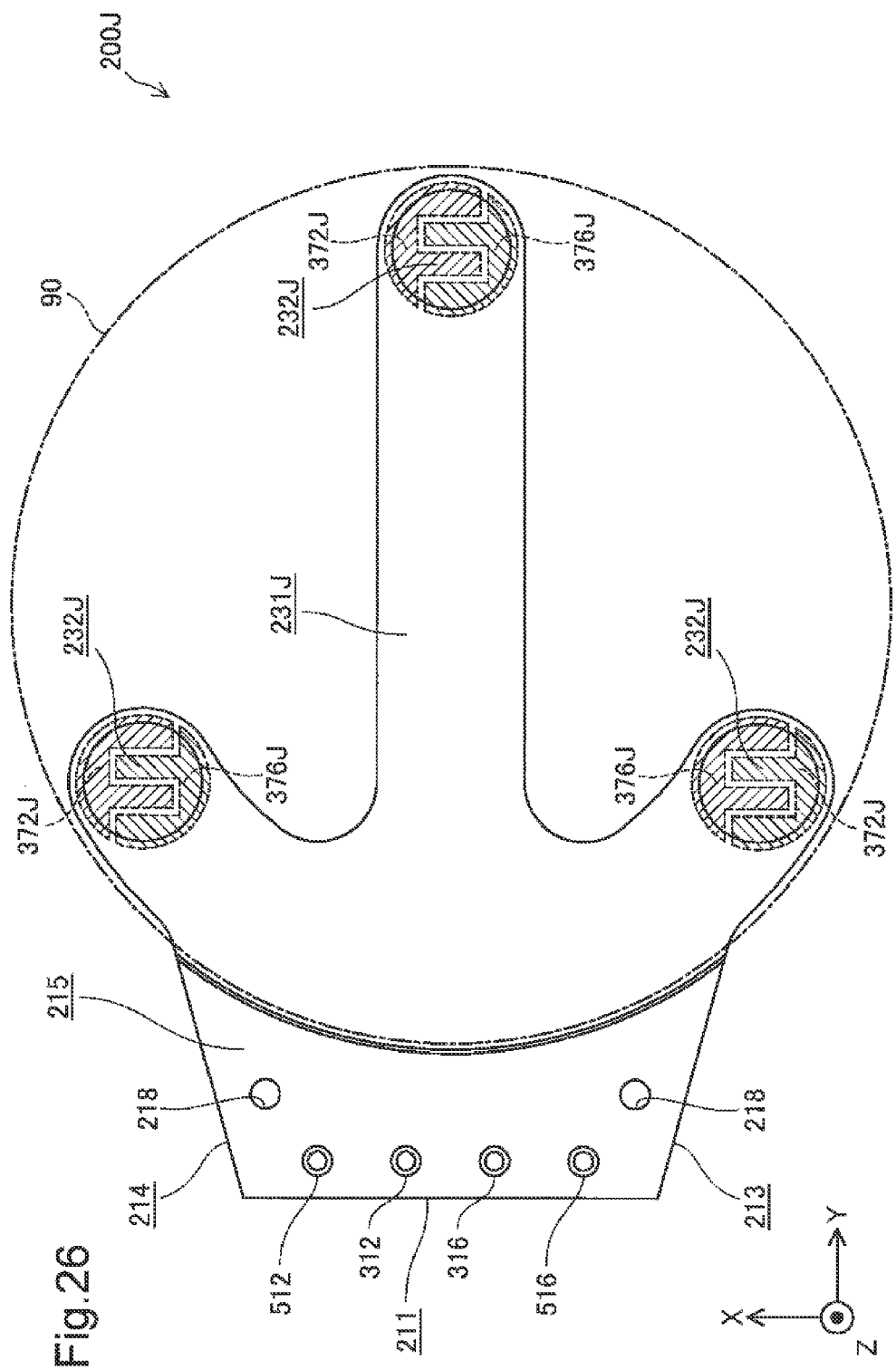

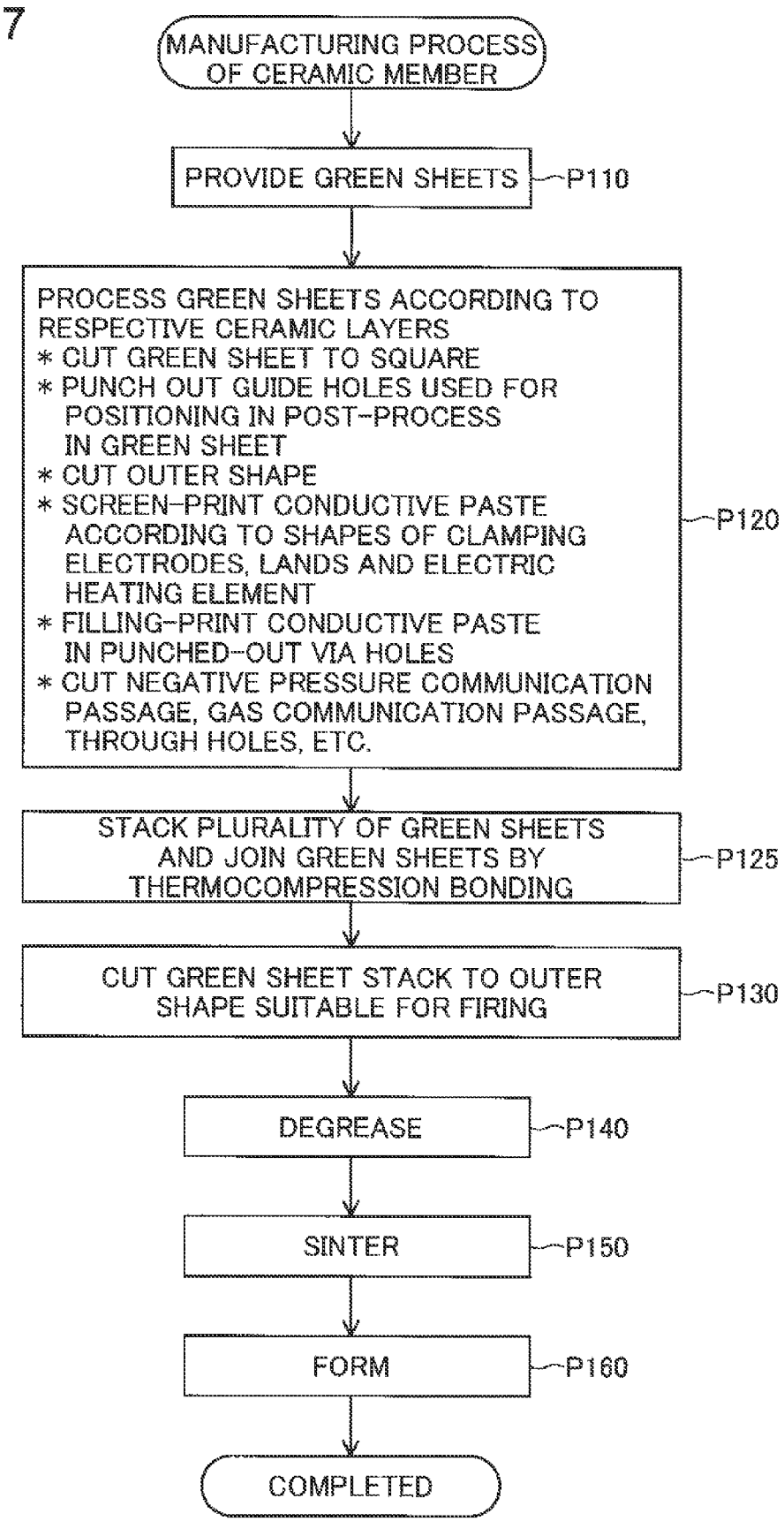

CARRIER DEVICE AND CERAMIC MEMBER

CROSS REFERENCE TO RELATED APPLICATIONS

This application is a National Stage of International Application No. PCT/JP2013/001244 filed Feb. 28, 2013, claiming priority based on Japanese Patent Application No. 2012-050209 filed Mar. 7, 2012, the contents of all of which are incorporated herein by reference in their entirety.

TECHNICAL FIELD

The present invention relates to a carrier device and a ceramic member.

BACKGROUND ART

A ceramic member used to hold a carried object in a carrier device is also called pick. A proposed ceramic member has a plurality of ceramic layers that are integrally sintered (see, for example, Patent Literature 1 and Patent Literature 2). Another proposed ceramic member is configured to use electrostatic force to attract a carried object that is a dielectric material (for example, wafer) (see, for example, Patent Literature 3). Clamping electrodes which are electrodes of generating electrostatic force are provided inside of the ceramic member configured to attract the carried object by electrostatic force.

CITATION LIST

Patent Literature

PTL 1: JP H04-37047A
PTL 2: JP 2009-202240A
PTL 3: JP 2011-77288A

SUMMARY

Technical Problem

Enhancement of electrostatic attraction force has been demanded for the ceramic member of the carrier device, due to various circumstances: for example, providing an attraction force to the carried object in a wide range of pressure environments from ordinary pressure to negative pressure (vacuum) or enhancing then attraction force applied to the carried object to meet the increased conveyance speed. The configuration of providing clamping electrodes inside of a ceramic member obtained by integrally sintering a plurality of ceramic layers has not been reviewed sufficiently. For example, some arrangement or shape of the clamping electrodes may cause a difficulty in layout of wiring for supplying electric power to the clamping electrodes. This may interfere with providing sufficient electrostatic attraction force.

Solution to Problem

The invention may be implemented by any of the following aspects and embodiments, in order to solve at least part of the above problems.

(1) According to one aspect of the invention, there is provided a ceramic member configured to be movable along with a carried object in a state of holding the carried object, in a carrier device. The ceramic member comprises: a plurality of ceramic layers that have insulating properties and are integrally sintered; an clamping electrode formed on a first ceramic layer among the plurality of ceramic layers and inside of the plurality of ceramic layers, and configured to attract a dielectric material by electrostatic force; a power feed port configured to receive a supply of electric power to the clamping electrode from outside of the ceramic member; a land formed on a second ceramic layer, which is different from the first ceramic layer among the plurality of ceramic layers, and configured to receive electric power through the power feed port; and a via arranged to pass through at least one of the plurality of ceramic layers and provided as a conductive material to electrically connect the clamping electrode with the land. The configuration of this aspect supplies electric power through the land formed on the second ceramic layer and the via to the clamping electrode formed on the first ceramic layer. This improves the flexibility of the arrangement and the shape of the clamping electrode on the first ceramic layer. As a result, this enhances the electrostatic attraction force and thereby improves the transport capacity of the carrier device.

(2) In the ceramic body of the above aspect, the clamping electrode may be located closer to a side holding the carried object than the land. The configuration of this aspect causes a greater amount of charges to be generated on the side holding the carried object and further enhances the electrostatic attraction force.

(3) The ceramic body of the above aspect may further comprise a first opposed surface and a second opposed surface provided as surfaces along a layer surface direction of the plurality of ceramic layers and arranged to face the carried object in the state of holding the carried object, wherein the second opposed surface may be located closer to the carried object than the first opposed surface, and at least part of the clamping electrode may be arranged to overlap with the second opposed surface in relation to a thickness direction perpendicular to the layer surface direction. The configuration of this aspect causes a greater amount of charges to be generated on the second opposed surface closer to the carried object and further enhances the electrostatic attraction force.

(4) In the ceramic body of the above aspect, the clamping electrode may comprise a first electrode and a second electrode configured to have potentials of different polarities, wherein the first electrode and the second electrode may be arranged to substantially equally overlap with the second opposed surface in relation to the thickness direction. The configuration of this aspect achieves good balance between positive charges and negative charges respectively generated on the ceramic member and the carried object.

(5) The ceramic body of the above aspect may further comprise a suction hole formed in the first opposed surface and configured to provide a negative pressure to the first opposed surface and thereby suck the carried object, wherein the second opposed surface may be arranged to surround the suction hole and the first opposed surface in relation to the thickness direction. The configuration of this aspect enables the negative pressure suction force to be applied to the carried object across the first opposed surface surrounded by the second opposed surface.

(6) According to another aspect of the invention, there is provided a carrier device configured to carry the carried object using the ceramic member of the above aspect. The configuration of this aspect enhances the attraction force of the ceramic member applied to the carried object. As a result, this improves the transport capacity of the carrier device.

The invention may be implemented by any of various aspects other than the ceramic member and the carrier device, for example, a carrier pick, a semiconductor manufacturing system, a conveyance method, and a manufacturing method of a ceramic member.

BRIEF DESCRIPTION OF DRAWINGS

FIG. 14 is a diagram illustrating a cross section of a ceramic member according to a fourth embodiment;

FIG. 15 is a diagram illustrating an upper surface of a ceramic member according to a fifth embodiment;

FIG. 25 is a diagram illustrating an upper surface of a ceramic member according to a tenth embodiment;

FIG. 26 is a diagram illustrating an upper surface of a ceramic member according to an eleventh embodiment; and FIG. 27 is a diagram illustrating a manufacturing process of the ceramic member.

DESCRIPTION OF EMBODIMENTS

A. First Embodiment

Figure 1:
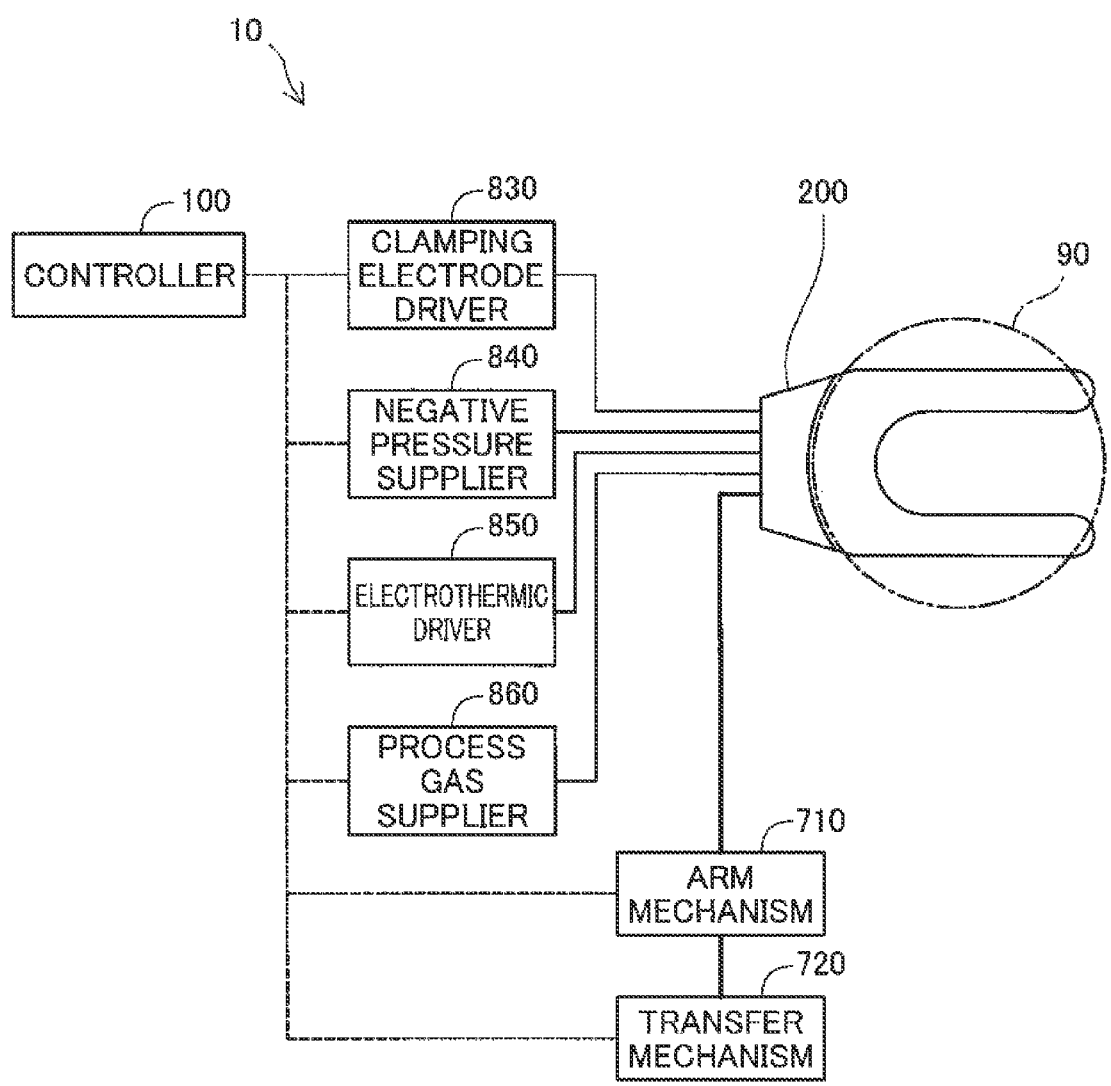
FIG. 1 is a diagram illustrating the configuration of a carrier device.

FIG. 1 is a diagram illustrating the configuration of a carrier device 10. The carrier device 10 conveys an object to be carried or a carried object 90. According to this embodiment, the carrier device 10 is provided as a device constituting part of a semiconductor manufacturing system, and the carried object 90 is a silicon wafer which is a disk-shaped dielectric material.

The carrier device 10 includes a controller 100, a ceramic member 200, an arm mechanism 710, a transfer mechanism 720, an clamping electrode driver 830, a negative pressure supplier 840, an electrothermic driver 850 and a process gas supplier 860.

The controller 100 of the carrier device 10 controls the operations of the respective constituents, i.e., the arm mechanism 710, the transfer mechanism 720, the clamping electrode driver 830, the negative pressure supplier 840, the electrothermic driver 850 and the process gas supplier 860. According to this embodiment, the functions of the controller 100 are implemented by a CPU (central processing unit) operating according to a computer program. According to another embodiment, the functions of the controller 100 may be implemented by an ASIC (application specific integrated circuit) operating according to circuit configuration thereof.

The arm mechanism 710 of the carrier device 10 is configured to couple the ceramic member 200 with the transfer mechanism 720 and serves to move the ceramic member 200 relative to the transfer mechanism 720 and receive and deliver the carried object 90 from and to outside of the carrier device 10. The transfer mechanism 720 of the carrier device 10 has the ceramic member 200 and the arm mechanism 710 mounted thereon and is configured to be movable relative to outside of the carrier device 10 and move the carried object 90 held by the ceramic member 200.

The ceramic member 200 of the carrier device 10 is also called pick and is configured to be movable along with the carried object 90 while holding the carried object 90 in the carrier device 10. The ceramic member 200 is produced by integrally sintering a plurality of ceramic layers made of an insulating ceramic material. A conductor pattern using a conductive material is formed inside of the ceramic member 200.

According to this embodiment, the major component of the insulating ceramic material used for the ceramic member 200 is aluminum oxide (alumina) ($Al_2O_3$). According to other embodiments, the major component of the insulating ceramic material may be yttria ($Y_2O_3$), silicon oxide ($SiO_2$), zirconium oxide ($ZrO_2$), magnesium oxide (MgO), mullite ($3Al_2O_3.2SiO_2$) or glass ceramic (for example, mixture of alumina and borosilicate glass).

According to this embodiment, the major component of the conductive material used for the ceramic member 200 is tungsten (W). According to other embodiments, the major component of the conductive material may be molybdenum (Mo), tantalum (Ta), silver (Ag) or copper (Cu) or may be an alloy of any of these conductive metals or conductive silicon carbide (SiC).

According to this embodiment, the ceramic member 200 is configured to receive a supply of electric power from the clamping electrode driver 830 and thereby use electrostatic force to attract the carried object 90 which is the dielectric material. The detailed structure for electrostatic attraction in the ceramic member 200 will be described later.

According to this embodiment, the ceramic member 200 is also configured to receive application of a negative pressure (vacuum) from the negative pressure supplier 840 and thereby suck the carried object 90 by the negative pressure. The detailed structure for negative pressure suction in the ceramic member 200 will be described later.

According to this embodiment, the ceramic member 200 is further configured to receive a supply of electric power from the electrothermic driver 850 and thereby generate heat. The detailed structure for heat generation in the ceramic member 200 will be described later.

According to this embodiment, the ceramic member 200 is also configured to receive a supply of process gas from the process gas supplier 860 and thereby release the process gas to the carried object 90. According to this embodiment, the process gas supplied to the ceramic member 200 by the process gas supplier 860 is a heat transfer gas (for example, helium (He) used to transfer the heat of the ceramic member 200 to the carried object 90. The detailed structure for release of process gas in the ceramic member 200 will be described later.

Figure 2:
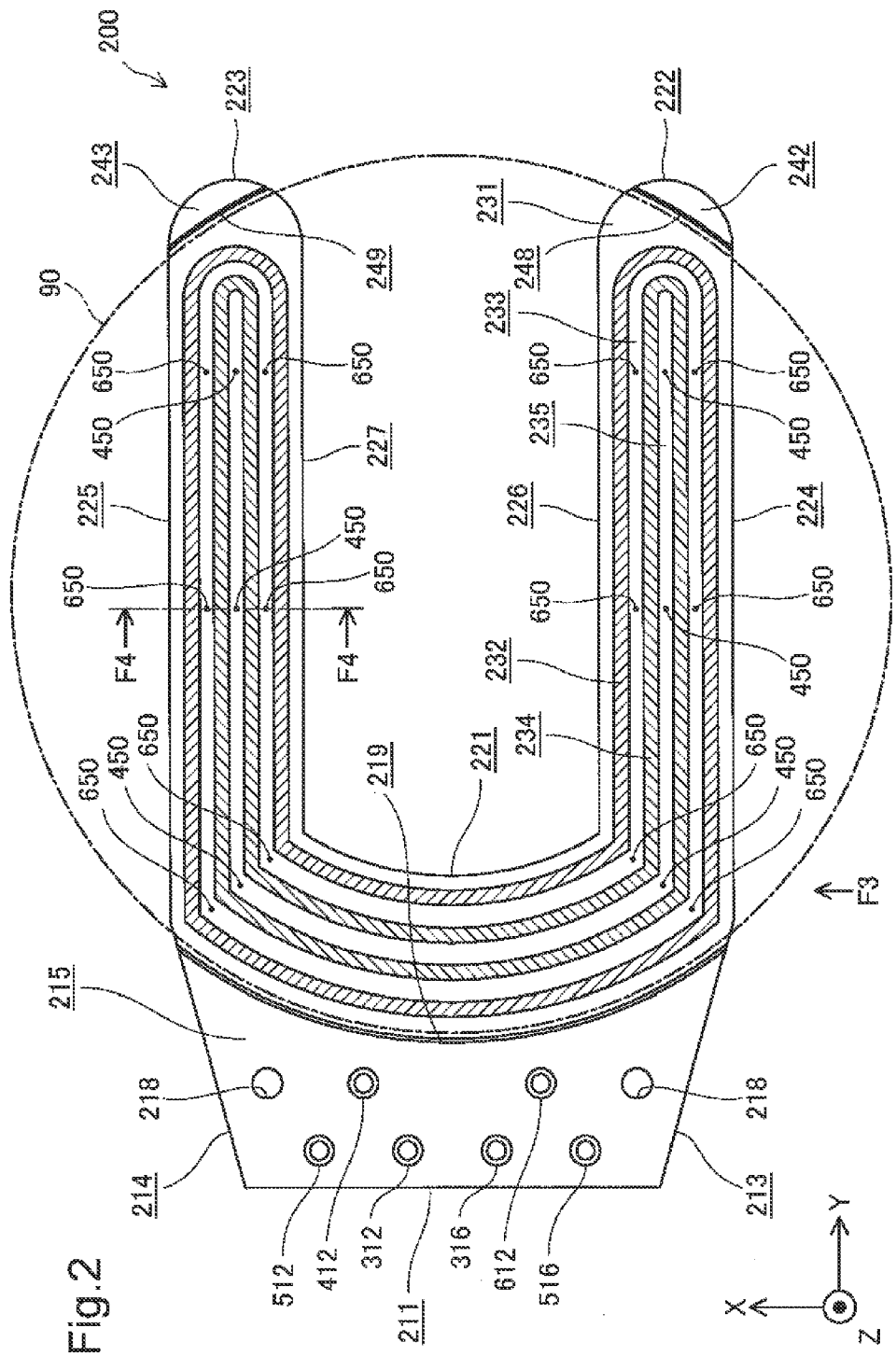
FIG. 2 is a diagram illustrating an upper surface of a ceramic member.
Figure 3:
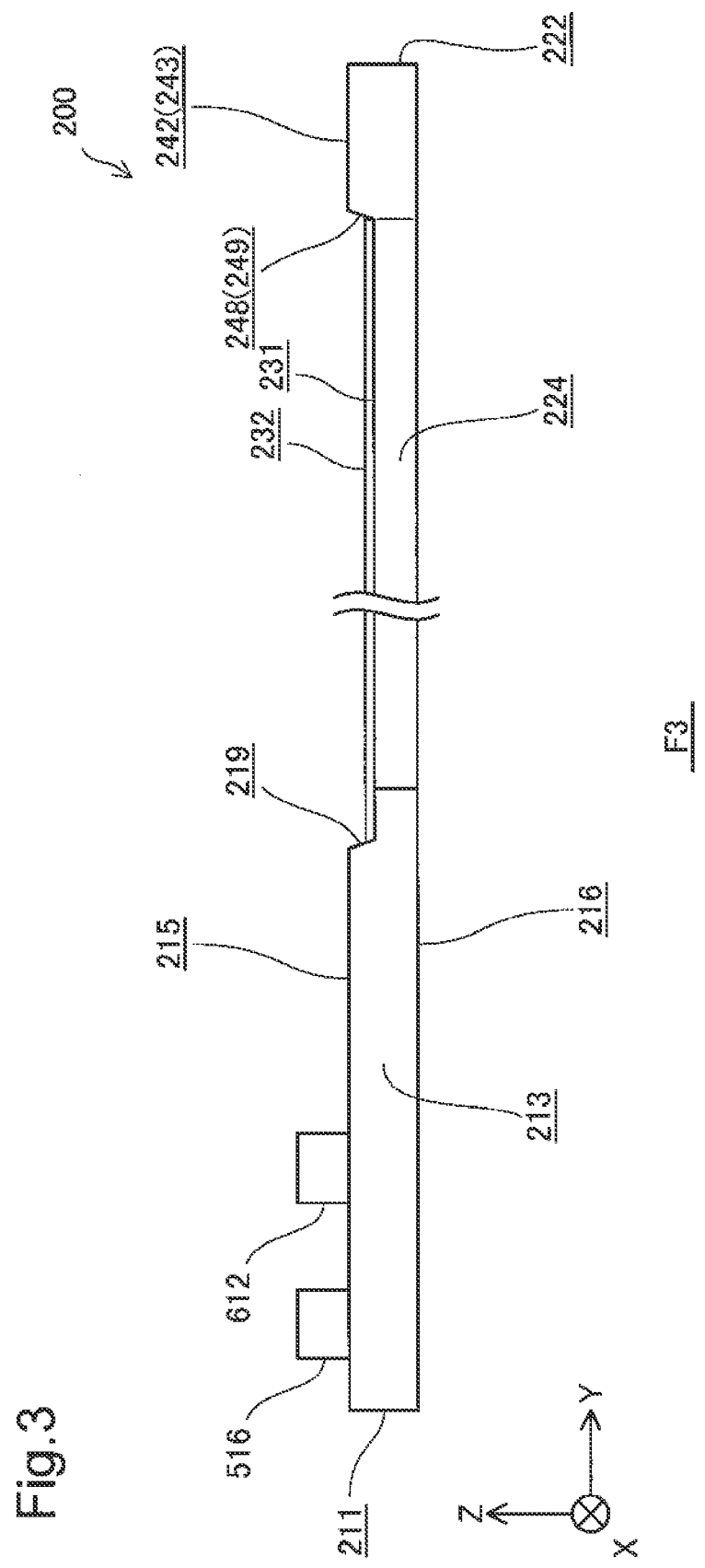
FIG. 3 is a diagram illustrating a side surface of the ceramic member viewed from an arrow F3 in FIG. 2.
Figure 4:
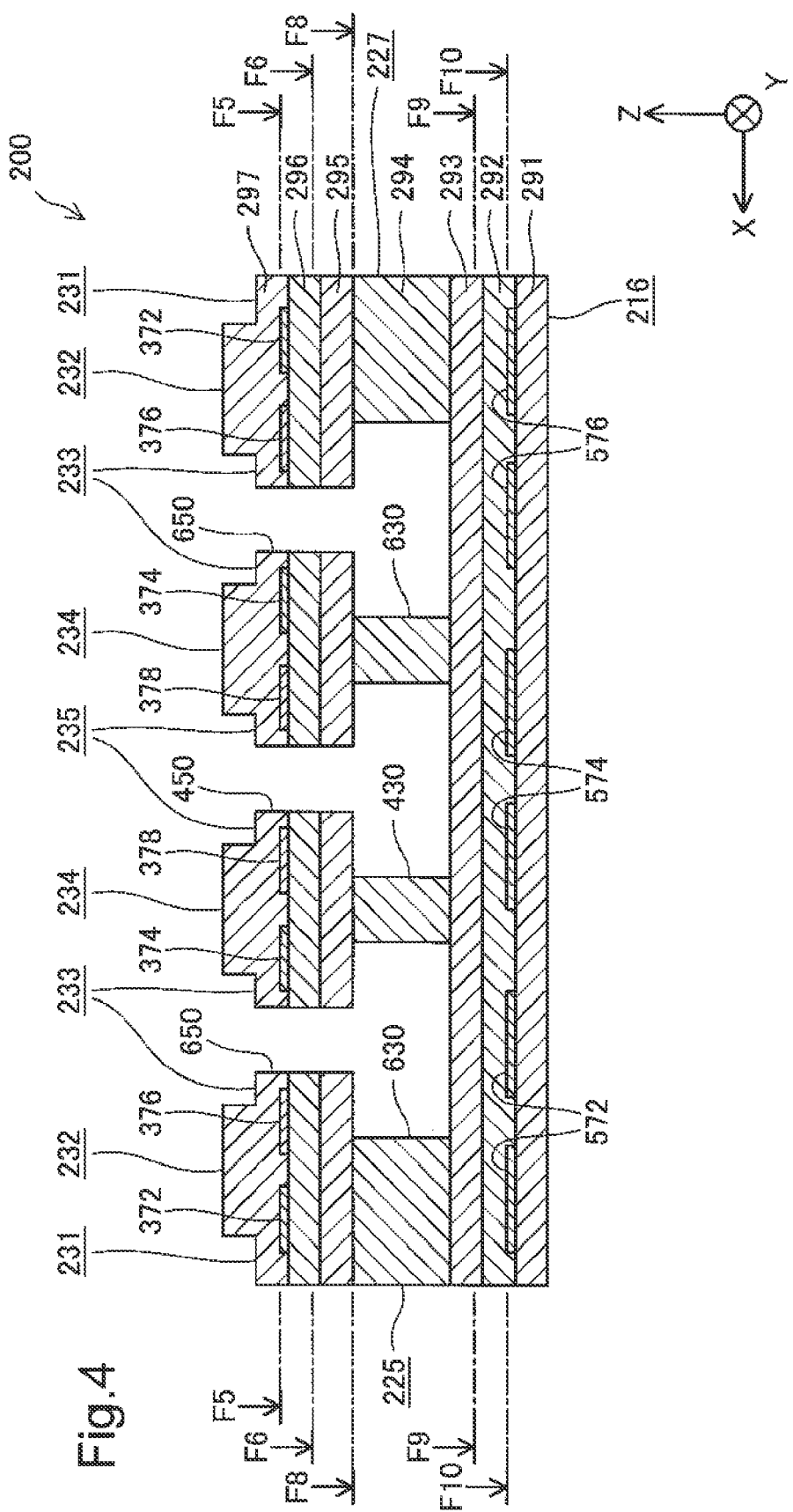
FIG. 4 is a diagram illustrating a cross section of the ceramic member taken on an arrow F4-F4 in FIG. 2.

FIG. 2 is a diagram illustrating an upper surface of the ceramic member 200. FIG. 3 is a diagram illustrating a side surface of the ceramic member 200 viewed from an arrow F3 in FIG. 2. FIG. 4 is a diagram illustrating a cross section of the ceramic member 200 taken on an arrow F4-F4 in FIG. 2. XYZ axes orthogonal to one another are illustrated in FIG. 2. The XYZ axes in FIG. 2 are equivalent to XYZ axes in FIGS. 3 and 4 and other drawings.

As shown in FIGS. 2 and 3, the ceramic member 200 is a nearly U-shaped plate according to this embodiment. In use of the ceramic member 200 in the carrier device 10, the axis along the horizontal direction of the U shape of the ceramic member 200 is specified as X axis; the axis along the vertical direction of the U shape is specified as Y axis; and the axis along the direction of gravitational force is specified as Z axis. The direction from right to left of the U shape of the ceramic member 200 is specified as +X-axis direction; and its reverse direction is specified as −X-axis direction. The direction from the closed end to the open end of the U shape of the ceramic member 200 is specified as +Y-axis direction; and its reverse direction is specified as −Y-axis direction. The direction from bottom to top in the direction of gravitational force is specified as +Z-axis direction; and its reverse direction is specified as −Z-axis direction. According to this embodiment, the carried object 90 is held on a surface parallel to the X axis and the Y axis of the ceramic member 200. The thickness direction of the ceramic member 200 is equal to the Z-axis direction.

As illustrated in FIG. 4, the ceramic member 200 has a plurality of ceramic layers or specifically seven ceramic layers 291, 292, 293, 294, 295, 296 and 297. These ceramic layers are stacked in the order of the ceramic layer 291, the ceramic layer 292, the ceramic layer 293, the ceramic layer 294, the ceramic layer 295, the ceramic layer 296 and the ceramic layer 297 from a bottom surface 216-side. The layer surface direction of these ceramic layers is the direction along a surface parallel to the X axis and the Y axis. The number of the ceramic layers in the ceramic member 200 is not limited to 7 layers but may be 6 or a less number of layers or alternatively may be 8 or a greater number of layers according to other embodiments.

The ceramic member 200 has a base end surface 211, base end side surfaces 213 and 214, a base end upper surface 215, a bottom surface 216, through holes 218, a base end stepped surface 219, open end surfaces 222 and 223, outer surfaces 224 and 225, inner surfaces 221, 226 and 227, opposed surfaces 231, 232, 233, 234 and 235, open end upper surfaces 242 and 243 and open end stepped surfaces 248 and 249.

The base end surface 211 of the ceramic member 200 is a surface that is parallel to the X axis and the Y axis and faces in the −Y-axis direction. The base end surface 211 is located at a −Y-axis direction end of the ceramic member 200 and forms a base end which is an end to be attached to the carrier device 10. The base end surface 211 is connected with the base end side surfaces 213 and 214, the base end upper surface 215 and the bottom surface 216.

The base end side surface 213 of the ceramic member 200 is a surface that faces in the −X-axis direction and in the −Y-axis direction and is parallel to the Z axis, and is formed between the base end surface 211 and the outer surface 224. The base end side surface 214 of the ceramic member 200 is a surface that faces in the +X-axis direction and in the −Y-axis direction and is parallel to the Z axis, and is formed between the base end surface 211 and the outer surface 225.

The base end upper surface 215 of the ceramic member 200 is a surface that is parallel to the X axis and the Y axis and faces in the +Z-axis direction. The base end upper surface 215 is connected with the base end surface 211 and the base end side surfaces 213 and 214. As illustrated in FIG. 3, the base end upper surface 215 is provided in the +Z-axis direction of the opposed surfaces 231 and 232. The base end stepped surface 219 is formed between the base end upper surface 215 and the opposed surface 231. According to this embodiment, as illustrated in FIG. 2, the +Y-axis side of the base end upper surface 215, the base end stepped surface 219 and the −Y-axis side of the opposed surface 231 are formed in an arc shape following the outer shape of the carried object 90.

The bottom surface 216 of the ceramic member 200 is a surface that is parallel to the X axis and the Y axis and faces in the −Z-axis direction. The bottom surface 216 is a nearly U-shaped surface like the overall geometry of the ceramic member 200 and is connected with the base end surface 211, the base end side surfaces 213 and 214, the open end surfaces 222 and 223, the outer surfaces 224 and 225 and the inner surfaces 221, 226 and 227.

The through holes 218 of the ceramic member 200 are formed to pass through along the Z axis between the base end upper surface 215 and the bottom surface 216. According to this embodiment, the ceramic member 200 is attached to the arm mechanism 710 using the through holes 218. The number of the through holes 218 is two according to this embodiment but may be three or more according to other embodiments.

The open end surfaces 222 and 223 of the ceramic member 200 are arc-shaped surfaces that are parallel to the Z axis and are convex in the +Y-axis direction. The open end surfaces 222 and 223 are located on the +Y-axis direction end of the ceramic member 200 and form open ends, where the opposed surfaces 231, 232, 233, 234 and 235 are located between the base end surface 211 and the open end surfaces 222 and 223. The open end surface 222 is located on the −X-axis side, and the open end surface 223 is located on the +X-axis side. The open end surface 222 is connected with the bottom surface 216, the outer surface 224, the inner surface 226, the opposed surface 231 and the open end upper surface 242. The open end surface 223 is connected with the bottom surface 216, the outer surface 225, the inner surface 227, the opposed surface 231 and the open end upper surface 243.

The outer surface 224 of the ceramic member 200 is a surface that is parallel to the Y axis and the Z axis and faces in the −X-axis direction, and is formed between the open end surface 222 and the base end side surface 213. The outer surface 225 of the ceramic member 200 is a surface that is parallel to the Y axis and the Z axis and faces in the +X-axis direction, and is formed between the open end surface 223 and the base end side surface 214. The outer surfaces 224 and 225 are outer circumferential parts that constitute the outer periphery of the ceramic member 200.

The inner surface 221 of the ceramic member 200 is an arc-shaped surface that is parallel to the Z axis and is concave in the +Y-axis direction, and is formed between the inner surface 226 and the inner surface 227. The inner surface 226 of the ceramic member 200 is a surface that is parallel to the Y axis and the Z axis and faces in the +X-axis direction, and is formed between the open end surface 222 and the inner surface 221. The inner surface 227 of the ceramic member 200 is a surface that is parallel to the Y axis and the Z axis and faces in the −X-axis direction, and is formed between the open end surface 223 and the inner surface 221. The inner surfaces 221, 226 and 227 are outer circumferential parts that constitute the outer periphery of the ceramic member 200.

The opposed surfaces 231, 232, 233, 234 and 235 of the ceramic member 200 are surfaces that are parallel to the X axis and the Y axis and face in the +Z-axis direction. The opposed surfaces 231, 232, 233, 234 and 235 are opposed to the carried object 90 in the state that the carried object 90 is held on the ceramic member 200. In FIG. 2, the opposed surfaces 232 and 234 are hatched for facilitating the understanding of illustration.

The opposed surfaces 231, 233 and 235 are first opposed surfaces located on the bottom surface 216-side of the opposed surfaces 232 and 234, i.e., in the −Z-axis direction of the opposed surfaces 232 and 234. The opposed surfaces 232 and 234 are second opposed surfaces located on the carried object 90-side of the opposed surfaces 231, 233 and 235, i.e., in the +Z-axis direction of the opposed surfaces 231, 233 and 235. The ceramic layer 297 is cut to form the opposed surfaces 231, 232, 233, 234 and 235, after integrally sintering the ceramic member 200.

According to this embodiment, as shown in FIG. 2, the opposed surface 235 is a nearly U-shaped plane in relation to the Z-axis direction. The opposed surface 234 is located in the +Z-axis direction of the opposed surface 235 and is a plane arranged to surround the outer periphery of the opposed surface 235 in relation to the Z-axis direction. The opposed surface 233 is located in the −Z-axis direction of the opposed surface 234 and is a plane arranged to surround the outer periphery of the opposed surface 234 in relation to the Z-axis direction. The opposed surface 232 is located in the +Z-axis direction of the opposed surface 233 and is a plane arranged to surround the outer periphery of the opposed surface 233 in relation to the Z-axis direction. The opposed surface 231 is located in the −Z-axis direction of the opposed surface 232 and is a plane arranged to surround the outer periphery of the opposed surface 232 in relation to the Z-axis direction. According to this embodiment, as shown in FIG. 4, the opposed surfaces 231, 233 and 235 are located at the same position in the Z-axis direction, and the opposed surfaces 232 and 234 are located at the same position in the Z-axis direction.

The open end upper surfaces 242 and 243 of the ceramic member 200 are surfaces that are parallel to the X axis and the Y axis and face in the +Z-axis direction. The open end upper surface 242 is connected with the open end surface 222, whereas the open end upper surface 243 is connected with the open end surface 223. As shown in FIG. 3, the open end upper surfaces 242 and 243 are provided in the +Z-axis direction of the opposed surfaces 231 and 232. The open end stepped surface 248 is formed between the open end upper surface 242 and the opposed surface 231, whereas the open end stepped surface 249 is formed between the open end upper surface 243 and the opposed surface 231. According to this embodiment, as shown in FIG. 2, the −Y-axis sides of the open end upper surfaces 242 and 243, the open end stepped surfaces 248 and 249 and the +Y-axis side of the opposed surface 231 are formed in an arc shape following the outer shape of the carried object 90.

As shown in FIGS. 2 and 4, suction holes 450 are formed in the opposed surface 235 of the ceramic member 200 as the holes configured to apply the negative pressure to the opposed surface 235 and thereby suck the carried object 90. The ceramic layers 295, 296 and 297 are cut to form the suction holes 450, before integrally sintering the ceramic member 200. The number of the suction holes 450 is 6 according to this embodiment but may be 5 or a less number or alternatively may be 7 or a greater number according to other embodiments.

As shown in FIGS. 2 and 4, gas release holes 650 are formed in the opposed surface 233 of the ceramic member 200 as the holes configured to release the process gas. The ceramic layers 295, 296 and 297 are cut to form the gas release holes 650, before integrally sintering the ceramic member 200. The number of the gas release holes 650 is 12 according to this embodiment but may be 11 or a less number or alternatively may be 13 or a greater number according to other embodiments.

As shown in FIGS. 2 and 3, the ceramic member 200 includes power feed ports 312 and 316, a negative pressure supply port 412, power feed ports 512 and 516 and a gas supply port 612.

The power feed ports 312 and 316 of the ceramic member 200 respectively receive supplies of electric power having potentials of reverse polarities from the clamping electrode driver 830. According to this embodiment, the power feed ports 312 and 316 are formed by brazing conductive metal terminals in a cylindrical shape protruded in the +Z-axis direction from the base end upper surface 215 and are configured to fix terminals of cables (not shown) which are connected with the clamping electrode driver 830.

The negative pressure supply port 412 of the ceramic member 200 receives a supply of negative pressure from the negative pressure supplier 840. According to this embodiment, the negative pressure supply port 412 is formed by brazing a conductive metal terminal in a cylindrical shape protruded in the +Z-axis direction from the base end upper surface 215 and is configured to fix an end of a tube (not shown) connected with the negative pressure supplier 840.

The power feed ports 512 and 516 of the ceramic member 200 respectively receive supplies of electric power from the electrothermic driver 850, where one power feed port corresponds to the positive electrode and the other power feed port corresponds to the negative electrode. According to this embodiment, the power feed ports 512 and 516 are formed by brazing conductive metal terminals in a cylindrical shape protruded in the +Z-axis direction from the base end upper surface 215 and are configured to fix terminals of cables (not shown) which are connected with the electrothermic driver 850.

The gas supply port 612 of the ceramic member 200 receives a supply of process gas from the process gas supplier 860. According to this embodiment, the gas supply port 612 is formed by brazing a conductive metal terminal in a cylindrical shape protruded in the +Z-axis direction from the base end upper surface 215 and is configured to fix an end of a tube (not shown) connected with the process gas supplier 860.

As shown in FIG. 4, clamping electrodes 372, 374, 376 and 378 are formed as conductive patterns between the ceramic layer 296 and the ceramic layer 297. A conductive paste containing a conductive material is screen-printed on the ceramic layer 296 to form the clamping electrodes 372, 374, 376 and 378, before stacking the ceramic layer 297 on the ceramic layer 296. According to this embodiment, the clamping electrodes 372 and 374 are first electrodes configured to have potentials of different polarity from that of the clamping electrodes 376 and 378. The clamping electrodes 376 and 378 are second electrodes configured to have potentials of different polarity from that of the clamping electrodes 372 and 374.

Figure 5:
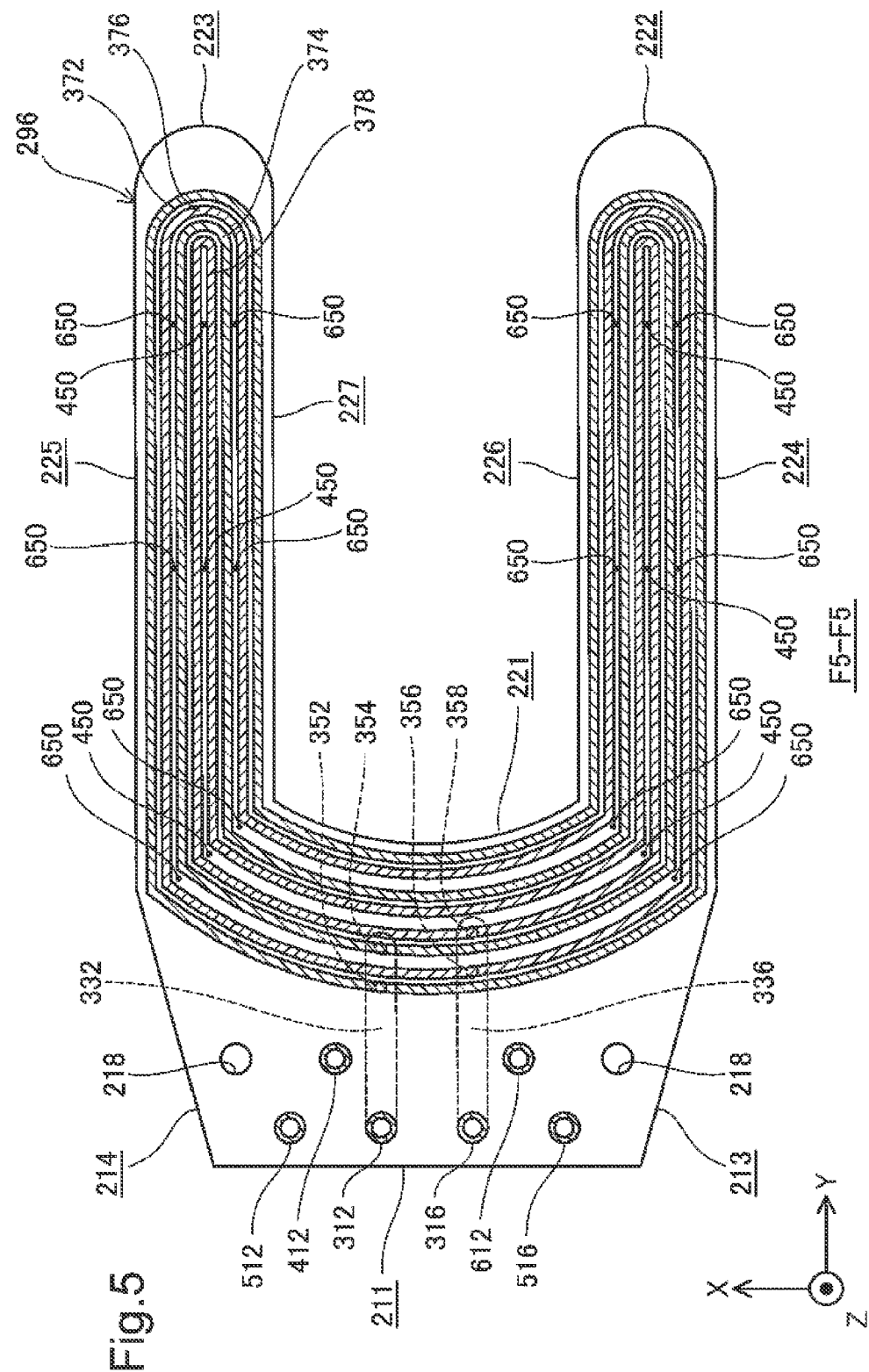
FIG. 5 is a diagram illustrating a ceramic layer viewed from the position corresponding to an arrow F5-F5 in FIG. 4.

FIG. 5 is a diagram illustrating the ceramic layer 296 viewed from the position corresponding to an arrow F5-F5 in FIG. 4. FIG. 5 illustrates the ceramic layer 296 with the clamping electrodes 372, 374, 376 and 378 formed thereon. In FIG. 5, the clamping electrodes 372, 374, 376 and 378 are hatched for facilitating the understanding of illustration. As shown in FIG. 5, the clamping electrodes 372, 374, 376 and 378 are formed by avoiding the positions of the suction holes 450 and the gas release holes 650.

As shown in FIGS. 2, 4 and 5, the clamping electrode 372 is stacked along the outer side of the opposed surface 232 in relation to the Z-axis direction. The clamping electrode 376 is stacked along the inner side of the opposed surface 232 in relation to the Z-axis direction. The clamping electrodes 372 and 376 are arranged to be almost equally stacked on the opposed surface 232 in relation to the Z-axis direction.

As shown in FIGS. 2, 4 and 5, the clamping electrode 374 is stacked along the outer side of the opposed surface 234 in relation to the Z-axis direction. The clamping electrode 378 is stacked along the inner side of the opposed surface 234 in relation to the Z-axis direction. The clamping electrodes 374 and 378 are arranged to be almost equally stacked on the opposed surface 234 in relation to the Z-axis direction.

Figure 6:
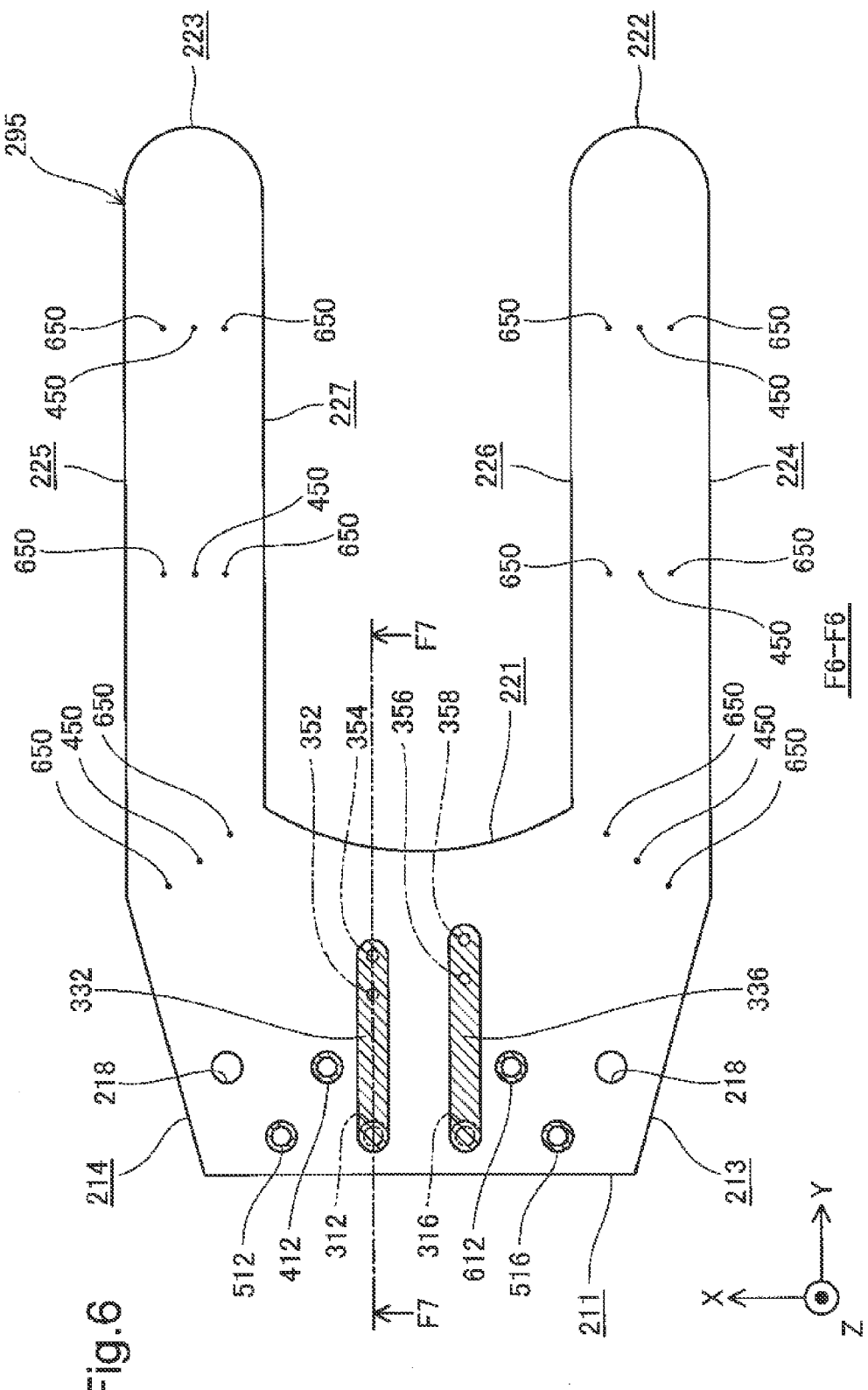
FIG. 6 is a diagram illustrating a ceramic layer viewed from the position corresponding to an arrow F6-F6 in FIG. 4.
Figure 7:
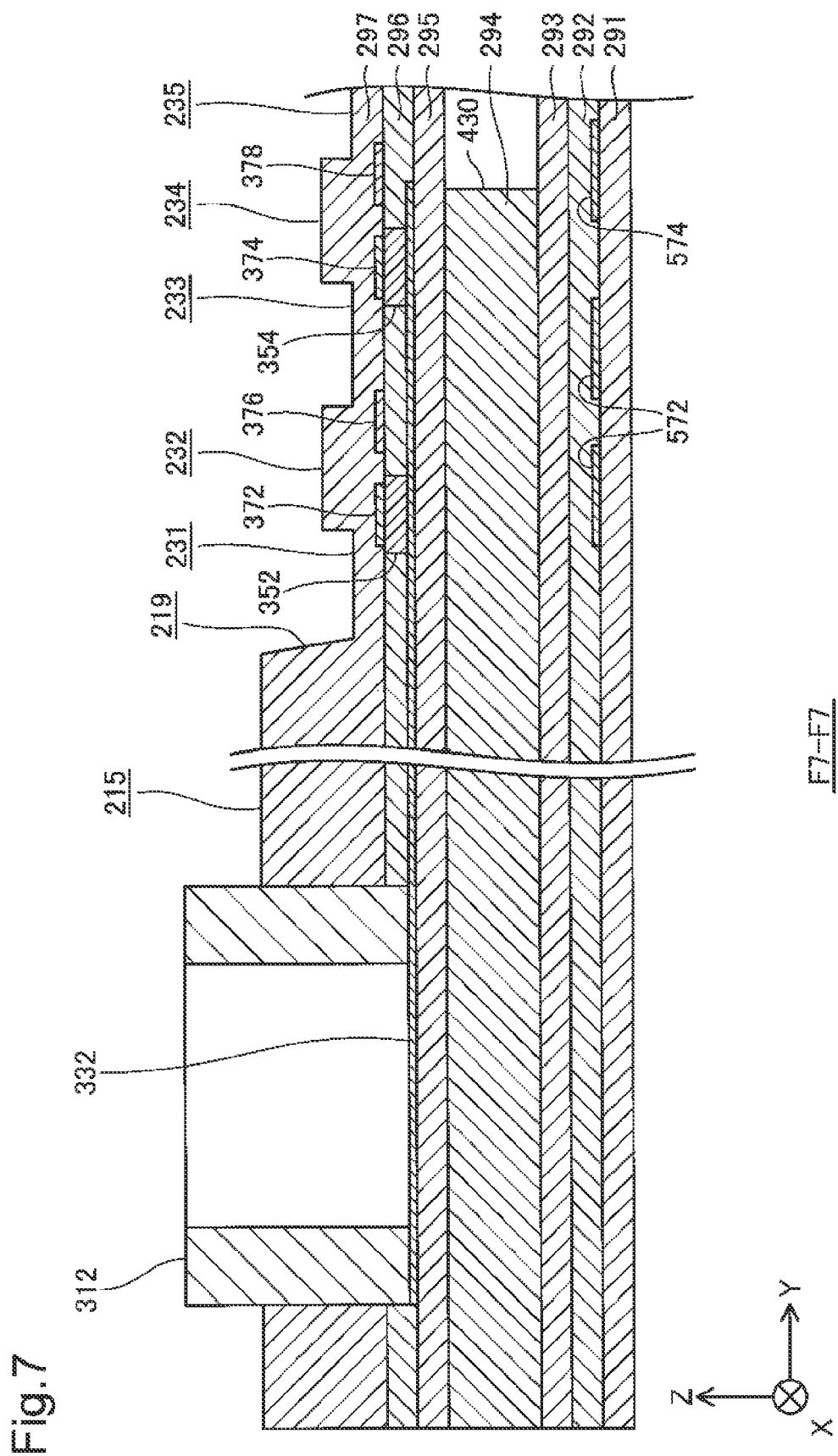
FIG. 7 is a diagram illustrating a cross section of the ceramic member viewed from the position taken on an arrow F7-F7 in FIG. 6.

FIG. 6 is a diagram illustrating the ceramic layer 295 viewed from the position corresponding to an arrow F6-F6 in FIG. 4. FIG. 7 is a diagram illustrating a cross section of the ceramic member 200 viewed from the position taken on an arrow F7-F7 in FIG. 6. As shown in FIGS. 6 and 7, lands 332 and 336 are formed as conductive patterns between the ceramic layer 295 and the ceramic layer 296. In FIG. 6, the lands 332 and 336 are hatched for facilitating the understanding of illustration. In FIG. 6, the power feed ports 312 and 316 are shown by the dot and dash line at the positions projected on the ceramic layer 295 along the Z-axis direction. In FIG. 5, the lands 332 and 336 are shown by the broken line.

A conductive paste containing a conductive material is screen-printed on the ceramic layer 295 to form the lands 332 and 336, before stacking the ceramic layer 296 on the ceramic layer 295.

The land 332 is a conductive material configured to receive electric power through the power feed port 312. According to this embodiment, the land 332 is exposed on the inside of the cylindrical power feed port 312, so as to enable electric power to be received through the power feed port 312.

The land 336 is a conductive material configured to receive electric power through the power feed port 316. According to this embodiment, the land 336 is exposed on the inside of the cylindrical power feed port 316, so as to enable electric power to be received through the power feed port 316.

As shown in FIG. 7, vias 352 and 354 are formed on the ceramic layer 296. Similarly, vias 356 and 358 are also formed on the ceramic layer 296. In FIG. 5, the vias 352, 354, 356 and 358 are shown by the broken line. In FIG. 6, the vias 352, 354, 356 and 358 are shown by the dot and dash line at the positions projected on the ceramic layer 295 along the Z-axis direction.

Through holes are formed in the ceramic layer 296 and a conductive paste containing a conductive material is filling-printed into the through holes to form the vias 352, 354, 356 and 358, before forming the clamping electrodes 372, 374, 376 and 378 on the ceramic layer 296.

The via 352 is a conductive material which passes through the ceramic layer 296 and electrically connects the land 332 with the clamping electrode 372. The via 354 is a conductive material which passes through the ceramic layer 296 and electrically connects the land 332 with the clamping electrode 374.

The via 356 is a conductive material which passes through the ceramic layer 296 and electrically connects the land 336 with the clamping electrode 376. The via 358 is a conductive material which passes through the ceramic layer 296 and electrically connects the land 336 with the clamping electrode 378.

As shown in FIG. 4, a negative pressure communication passage 430 and a gas communication passage 630 are formed in the ceramic layer 294. The negative pressure communication passage 430 is a flow path arranged to communicate between the negative pressure supply port 412 and the suction holes 450. The gas communication passage 630 is a flow path arranged to communicate between the gas supply port 612 and the gas release holes 650. The ceramic layer 294 is cut to form the negative pressure communication passage 430 and the gas communication passage 630, before stacking the ceramic layer 295 on the ceramic layer 294.

Figure 8:
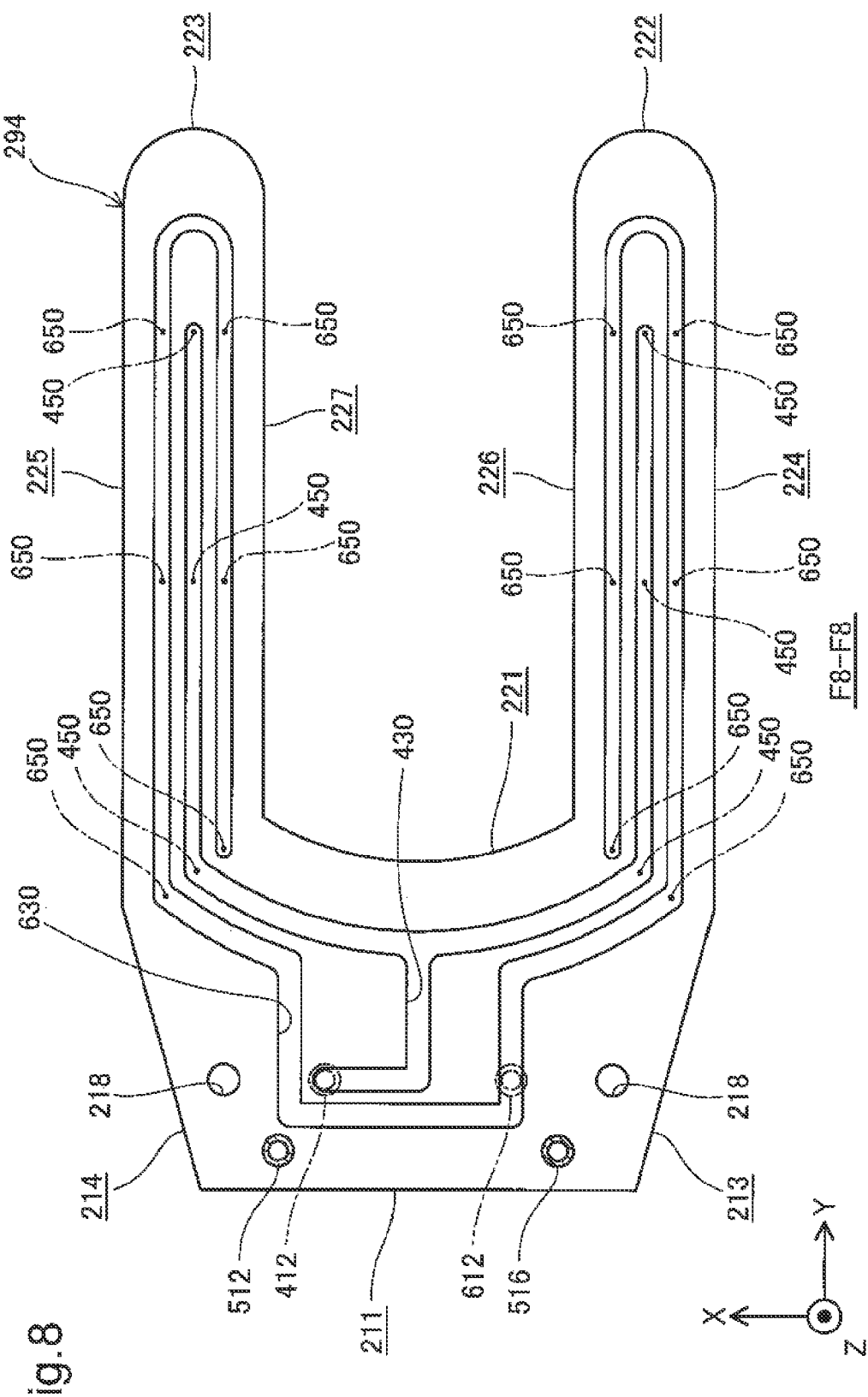
FIG. 8 is a diagram illustrating a ceramic layer viewed from the position corresponding to an arrow F8-F8 in FIG. 4.

FIG. 8 is a diagram illustrating the ceramic layer 294 viewed from the position corresponding to an arrow F8-F8 in FIG. 4. In FIG. 8, the negative pressure supply port 412, the suction holes 450, the gas supply port 612 and the gas release holes 650 are shown by the dot and dash line at the positions projected on the ceramic layer 294 along the Z-axis direction.

According to this embodiment, the negative pressure communication passage 430 runs from the position corresponding to the negative pressure supply port 412 toward the inner surface 221 and then branches into two flow paths toward the open end surface 222 and toward the open end surface 223 which go through the positions corresponding to the six suction holes 450. According to this embodiment, the gas communication passage 630 branches from the position corresponding to the gas supply port 612 into two flow paths toward the open end surface 222 and toward the open end surface 223. The one branch flow path goes through the positions corresponding to the six gas release holes 650 along the outer surface 224, the open end surface 222 and the inner surface 226 in this order. The other branch flow path goes through the positions corresponding to the six gas release holes 650 along the outer surface 225, the open end surface 223 and the inner surface 227 in this order.

As shown in FIG. 4, electric heating elements 572, 574 and 576 are formed as conductive patterns between the ceramic layer 291 and the ceramic layer 292. A conductive paste containing a conductive material is screen-printed on the ceramic layer 291 to form the electric heating elements 572, 574 and 576, before stacking the ceramic layer 292 on the ceramic layer 291.

Figure 9:
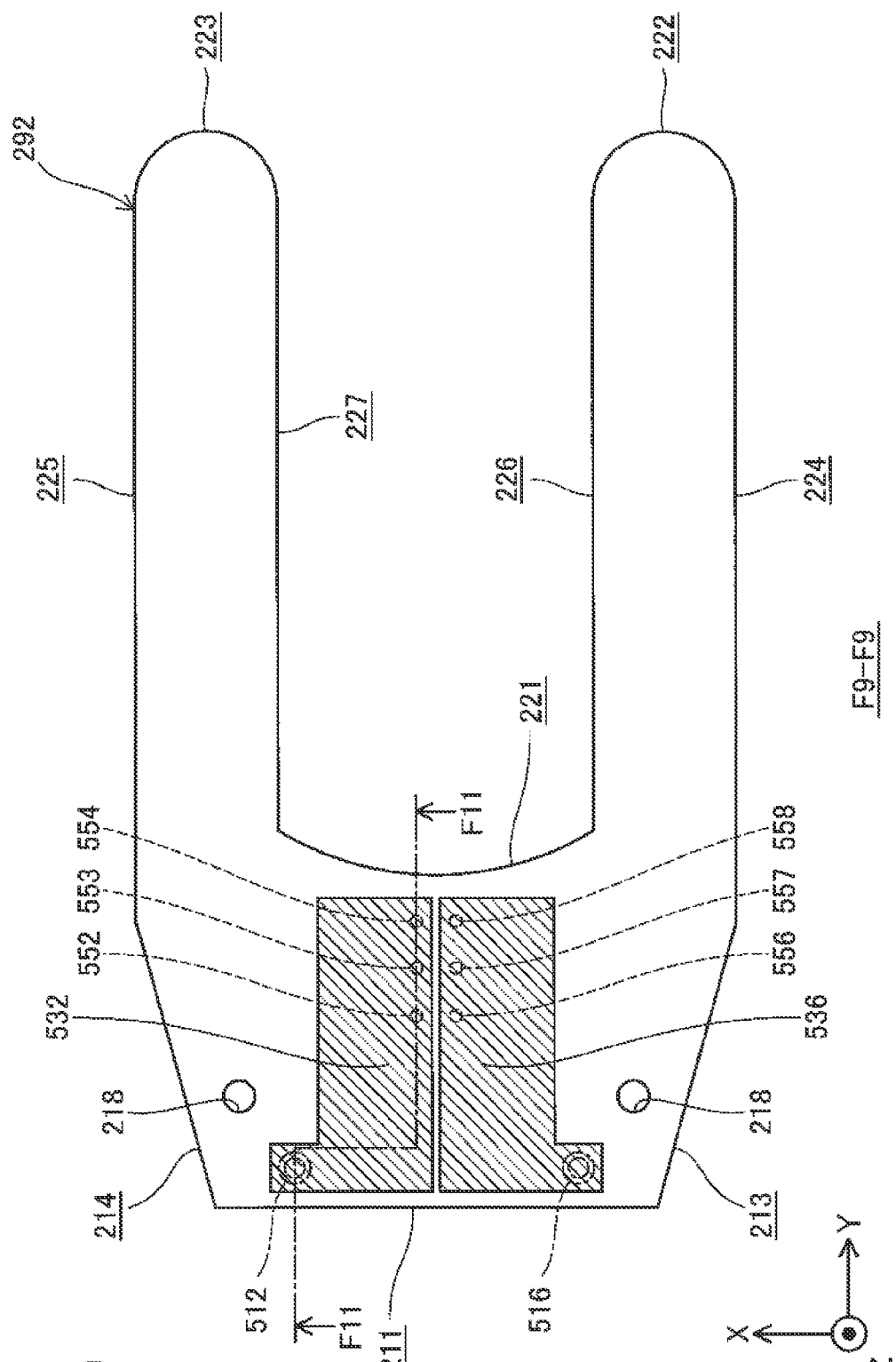
FIG. 9 is a diagram illustrating a ceramic layer viewed from the position corresponding to an arrow F9-F9 in FIG. 4.
Figure 10:
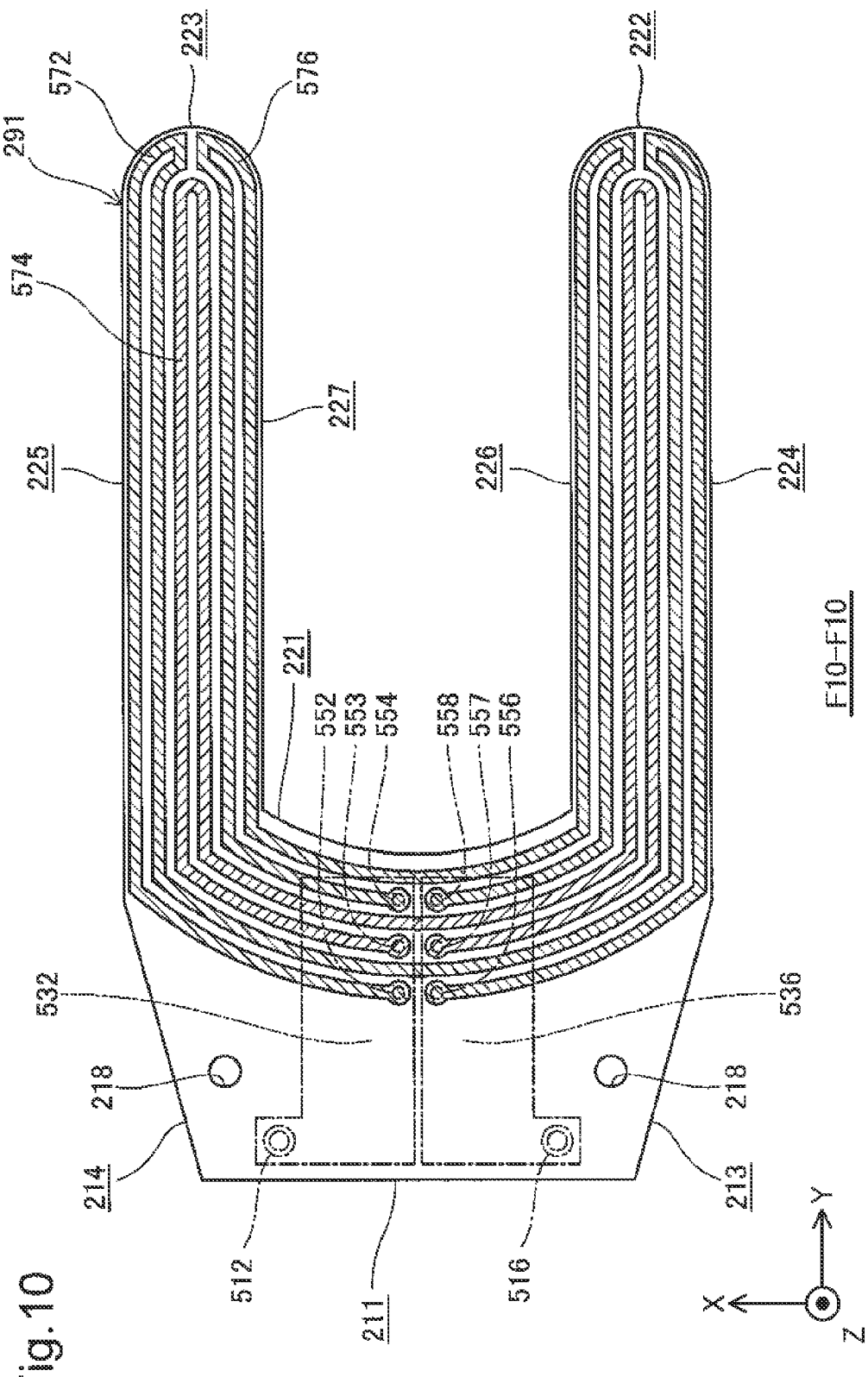
FIG. 10 is a diagram illustrating a ceramic layer viewed from the position corresponding to an arrow F10-F10 in FIG. 4.
Figure 11:
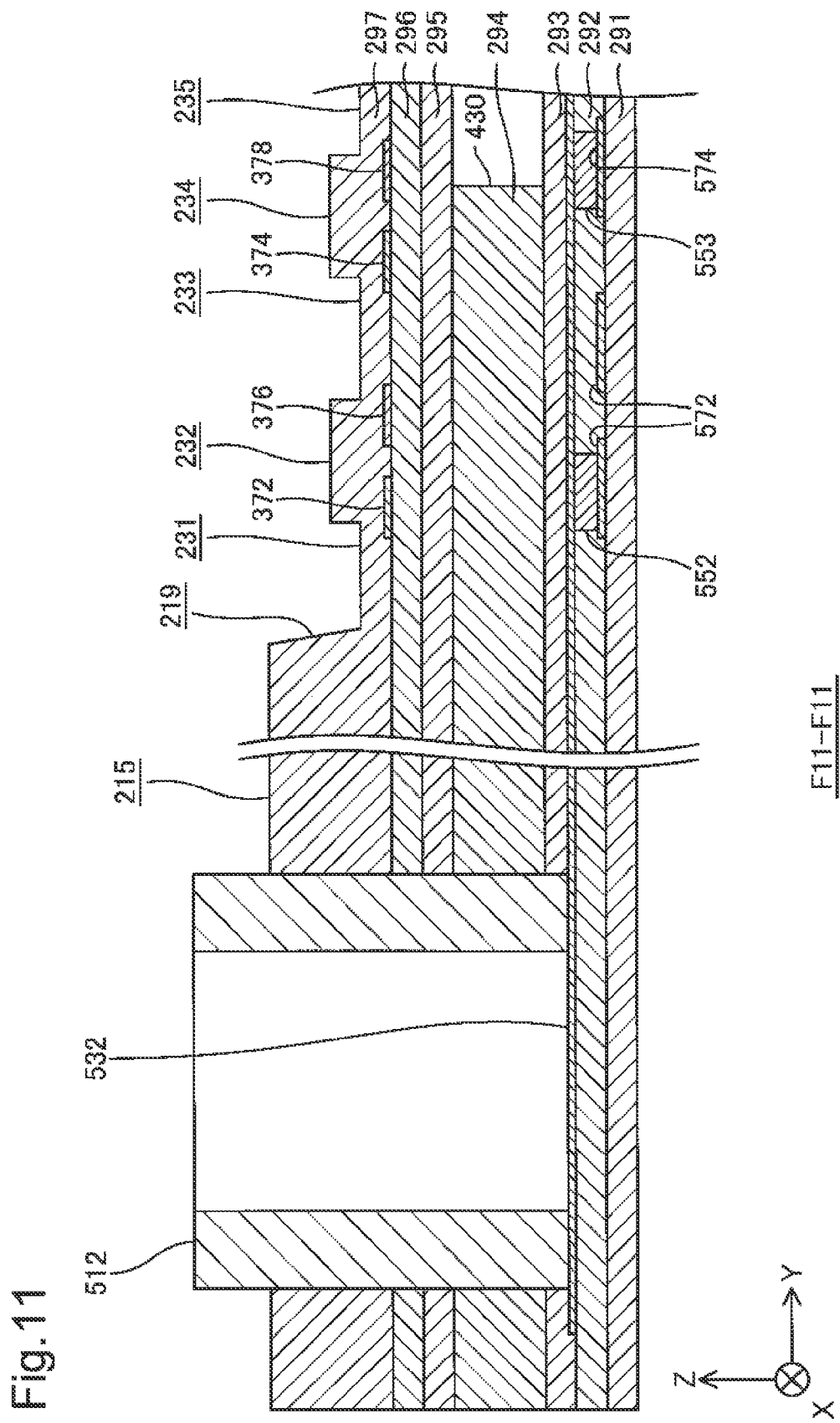
FIG. 11 is a diagram illustrating a cross section of the ceramic member viewed from the position taken on an arrow F11-F11 in FIG. 9.

FIG. 9 is a diagram illustrating the ceramic layer 292 viewed from the position corresponding to an arrow F9-F9 in FIG. 4. FIG. 10 is a diagram illustrating the ceramic layer 291 viewed from the position corresponding to an arrow F10-F10 in FIG. 4. FIG. 11 is a diagram illustrating a cross section of the ceramic member 200 viewed from the position taken on an arrow F11-F11 in FIG. 9. In FIG. 10, the electric heating elements 572, 574 and 576 are hatched for facilitating the understanding of illustration.

As shown in FIG. 10, according to this embodiment, the electric heating elements 572 and 576 are first electric heating elements arranged along the outer periphery of the ceramic layer 291. The electric heating element 574 is a second electric heating element arranged on the inner side of the electric heating elements 572 and 576. According to this embodiment, the electric heating elements 572 and 576 are made of a conductive material having a higher resistance value than that of the electric heating element 574, so that the electric heating elements 572 and 576 are configured to have the higher amount of heat generation per unit area than that of the electric heating element 574. According to another embodiment, higher electric current may be supplied to the electric heating elements 572 and 576 than that supplied to the electric heating element 574, so that the electric heating elements 572 and 576 are configured to have the higher amount of heat generation per unit area than that of the electric heating element 574. According to a further embodiment, the electric heating elements 572, 574 and 576 may be configured to have substantially the same amount of heat generation per unit area.

As shown in FIGS. 9 to 11, lands 532 and 536 are formed as conductive patterns between the ceramic layer 292 and the ceramic layer 293. In FIG. 9, the lands 532 and 536 are hatched for facilitating the understanding of illustration. In FIG. 9, the power feed ports 512 and 516 are shown by the dot and dash line at the positions projected on the ceramic layer 292 along the Z-axis direction. In FIG. 10, the lands 532 and 536 are shown by the dot and dash line at the positions projected on the ceramic layer 291 along the Z-axis direction.

A conductive paste containing a conductive material is screen-printed on the ceramic layer 292 to form the lands 532 and 536, before stacking the ceramic layer 293 on the ceramic layer 292.

The land 532 is a conductive material configured to receive electric power through the power feed port 512. According to this embodiment, the land 532 is exposed on the inside of the cylindrical power feed port 512, so as to enable electric power to be received through the power feed port 512.

The land 536 is a conductive material configured to receive electric power through the power feed port 516. According to this embodiment, the land 536 is exposed on the inside of the cylindrical power feed port 516, so as to enable electric power to be received through the power feed port 516.

As shown in FIGS. 9 and 11, vias 552, 553 and 554 and vias 556, 557 and 558 are formed on the ceramic layer 292. In FIG. 9, the vias 552, 553 and 554 and the vias 556, 557 and 558 are shown by the broken line. In FIG. 10, the power feed ports 512 and 516, the lands 532 and 536, the vias 552, 553 and 554 and the vias 556, 557 and 558 are shown by the dot and dash line at the positions projected on the ceramic layer 291 along the Z-axis direction.

Through holes are formed in the ceramic layer 292 and a conductive paste containing a conductive material is filling-printed into the through holes to form the vias 552, 553 and 554 and the vias 556, 557 and 558, before forming the lands 532 and 536 on the ceramic layer 292.

The via 552 is a conductive material which passes through the ceramic layer 292 and electrically connects a +X-axis direction end of the electric heating element 572 with the land 532. The via 553 is a conductive material which passes through the ceramic layer 292 and electrically connects a +X-axis direction end of the electric heating element 574 with the land 532. The via 554 is a conductive material which passes through the ceramic layer 292 and electrically connects a +X-axis direction end of the electric heating element 576 with the land 532.

The via 556 is a conductive material which passes through the ceramic layer 292 and electrically connects a −X-axis direction end of the electric heating element 572 with the land 536. The via 557 is a conductive material which passes through the ceramic layer 292 and electrically connects a −X-axis direction end of the electric heating element 574 with the land 536. The via 558 is a conductive material which passes through the ceramic layer 292 and electrically connects a −X-axis direction end of the electric heating element 576 with the land 536.

FIG. 27 is a diagram showing a manufacturing process of the ceramic member 200. In manufacturing the ceramic member 200, green sheets are first provided to form the ceramic layers 291 to 297 (step P110). The green sheets are obtained by mixing an organic binder, a plasticizer and a solvent with insulating ceramic material powder and molding the mixture into a sheet form.

After providing the green sheets (step P110), the green sheets are processed according to the respective structures of the ceramic layers 291 to 297 (step P120). More specifically, each green sheet is cut to a square and guide holes suitable for positioning in post-processes (screen printing, cutting work and thermocompression bonding) are punched out in the outer periphery of the green sheet. Then a conductive paste is screen printed on the surface of the green sheets according to the shapes of the clamping electrodes 372, 374, 376 and 378, the lands 332 and 336, the electric heating elements 572, 574 and 576 and the lands 532 and 536 as appropriate. Via holes as through holes are punched out and a conductive paste is filling-printed into the via holes at the positions whether the vias 352, 354, 356 and 358 and the vias 552, 553, 554, 556, 557 and 558 are to be formed, as appropriate. The through holes 218, the negative pressure communication passage 430, the suction holes 450, the gas communication passage 630 and the gas release holes 650 are cut in the green sheets as appropriate.

After processing the green sheets according to the respective ceramic layers 291 to 297 (step P120), the plurality of green sheets corresponding to the respective ceramic layers 291 to 297 are stacked and the adjacent ceramic layers are joined by thermocompression bonding (step P125). This forms a green sheet stack where the plurality of green sheets are stacked.

After forming the green sheet stack (step P125), the green sheet stack is cut to an outer shape suitable for sintering in post-process (step P130).

After cutting the green sheet stack (step P130), the green sheet stack is degreased (step P140). More specifically, the green sheet stack is exposed in an atmosphere at 250° C. for 10 hours to be degreased.

After degreasing the green sheet stack (step P140), the green sheet stack is sintered integrally. More specifically, the green sheet stack is sintered in a reduced atmosphere at 1400 to 1600° C. (step P150). This causes alumina from the green sheet and tungsten from the conductive paste to be simultaneously sintered and obtains a sintered body having the internal structure of the ceramic member 200 formed therein.

After sintering (step P150), the sintered body is formed to the ceramic member 200 (step P160). More specifically, the outer shape of the sintered body is grinded and cut to be suitable for the ceramic member 200. The opposed surfaces 231, 233 and 235 are formed by grinding and cutting according to this embodiment but may be formed by blast processing according to another embodiment.

In the first embodiment described above, the clamping electrodes 372, 374, 376 and 378 are formed on the ceramic layer 296 which is the first ceramic layer. The lands 332 and 336 configured to receive electric power through the power feed ports 312 and 316 are formed on the ceramic layer 295 which is the second ceramic layer. The vias 352, 354, 356 and 358 are formed to pass through the ceramic layer 296 and electrically connect the clamping electrodes 372, 374, 376 and 378 with the lands 332 and 336. According to this first embodiment, electric power is supplied through the lands 332 and 336 formed on the ceramic layer 295 and the vias 352, 354, 356 and 358 to the clamping electrodes 372, 374, 376 and 378 formed on the ceramic layer 296. This configuration improves the flexibility of the arrangement and the shape of the clamping electrodes 372, 374, 376 and 378 on the ceramic layer 296. As a result, this enhances the electrostatic attraction force and thereby improves the transport capacity of the carrier device 10.

The clamping electrodes 372, 374, 376 and 378 are located closer to the side holding the carried object 90 than the lands 332 and 336 (i.e., in the +Z-axis direction). This causes a greater amount of charges to be generated on the side holding the carried object 90 (i.e., on the side of the opposed surfaces 231, 232, 233, 234 and 235) and thereby further enhances the electrostatic attraction force.

The opposed surfaces 232 and 234 as the second opposed surfaces are located closer to the side holding the carried object 90 than the opposed surfaces 231, 233 and 235 as the first opposed surfaces (i.e., in the +Z-axis direction). The clamping electrodes 372, 374, 376 and 378 are arranged such that at least part of the clamping electrodes 372, 374, 376 and 378 overlap with the opposed surfaces 232 and 234 in relation to the Z-axis direction. This arrangement causes a greater amount of charges to be generated on the opposed surfaces 232 and 234 closer to the side holding carried object 90 and thereby further enhances the electrostatic attraction force.

The clamping electrodes 372 and 374 as the first electrodes and the clamping electrodes 376 and 378 as the second electrodes are configured to have potentials of different polarities. The clamping electrodes 372 and 374 and the clamping electrodes 376 and 378 are also arranged such as to substantially equally overlap with the opposed surfaces 232 and 234 in relation to the Z-axis direction. This achieves the good balance between the positive charges and the negative charges respectively generated on the ceramic member 200 and the carried object 90.

The opposed surface 235 with the suction holes 450 formed therein is surrounded by the opposed surface 234 in relation to the Z-axis direction, so that the negative pressure suction force is applied to the carried object 90 across the opposed surface 235 surrounded by the opposed surface 234.

According to the first embodiment, the gas communication passage 630 communicating with the gas supply port 612 is formed in the ceramic layer 294, and the gas release holes 650 are formed to pass through from the gas communication passage 630 to the opposed surface 233. The configuration of this first embodiment releases the heat transfer gas (process gas) through the gas release holes 650 to the opposed surface 233 and causes the heat transfer gas to be present between the carried object 90 and the ceramic member 200 (especially, in the gaps between the carried object 90 and the opposed surfaces 232 and 234), thereby accelerating heat transfer from the ceramic member 200 to the carried object 90. This arrangement allows for effective temperature control of the carried object 90, while providing the electrostatic attraction. As a result, this shortens the time required for temperature control of the carried object 90 and thereby improves the transport capacity of the carrier device 10.

In the first embodiment, the clamping electrodes 372, 374, 376 and 378 are formed on the ceramic layer 297 to provide electrostatic attraction force. Electric power is supplied through the lands 532 and 536 formed on the ceramic layer 292 and the vias 552, 553, 554, 556, 557 and 558 to the electric heating elements 572, 574 and 576 formed on the ceramic layer 291. The configuration of this first embodiment improves the flexibility of the arrangement and the shape of the electric heating elements 572, 574 and 576 on the ceramic layer 291. As a result, this effectively allows for temperature control by the electric heating elements 572, 574 and 576 without interfering with the electrostatic attraction force and thereby improves the transport capacity of the carrier device 10.

The electric heating elements 572, 574 and 476 are located closer to the bottom surface 216 than the opposed surfaces 231, 232, 233, 234 and 235. This arrangement suppresses the uneven temperature on the opposed surfaces 231, 232, 233, 234 and 235 and further effectively allows for temperature control by the electric heating elements 572, 574 and 576.

The electric heating elements 572 and 576 as the first electric heating elements arranged on the outer peripheral side are configured to have the higher amount of heat generation per unit area than the electric heating element 574 as the second electric heating element arranged on the inner side. This arrangement suppresses the uneven temperature between the outer peripheral side and the inner side of the ceramic member 200 and further effectively allows for temperature control by the electric heating elements 572, 574 and 576.

B. Second Embodiment

In the description of a second embodiment, the like constituents to those of the first embodiment are shown by the like numerical symbols as those of the first embodiment. Constituents having different shapes or arrangements but corresponding to those of the first embodiment are shown by suffixing an alphabetical code "A" to the numerical symbols of the first embodiment.

Figure 12A:
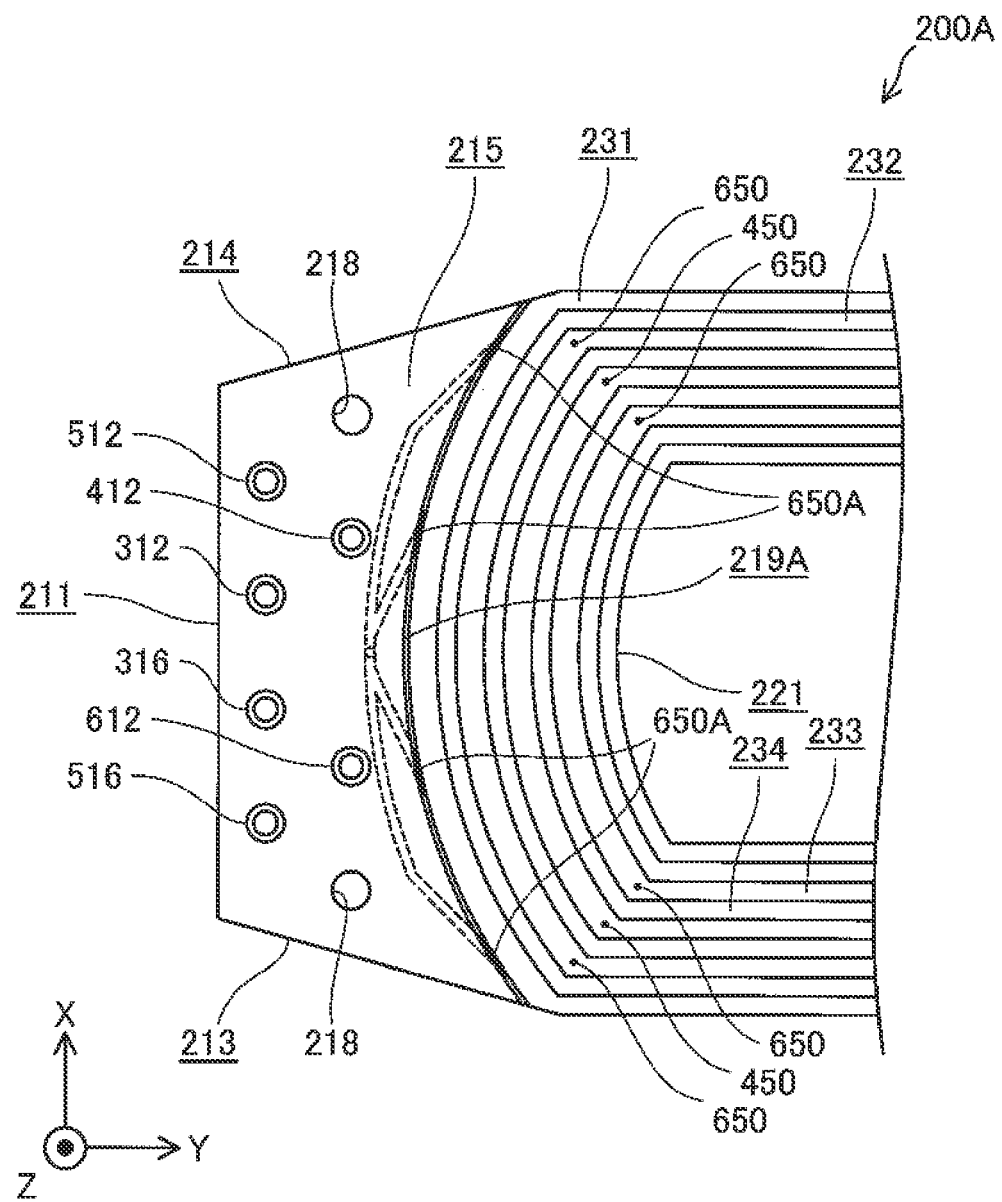
FIG. 12A is a diagram illustrating an upper surface of a ceramic member according to a second embodiment.
Figure 12B:
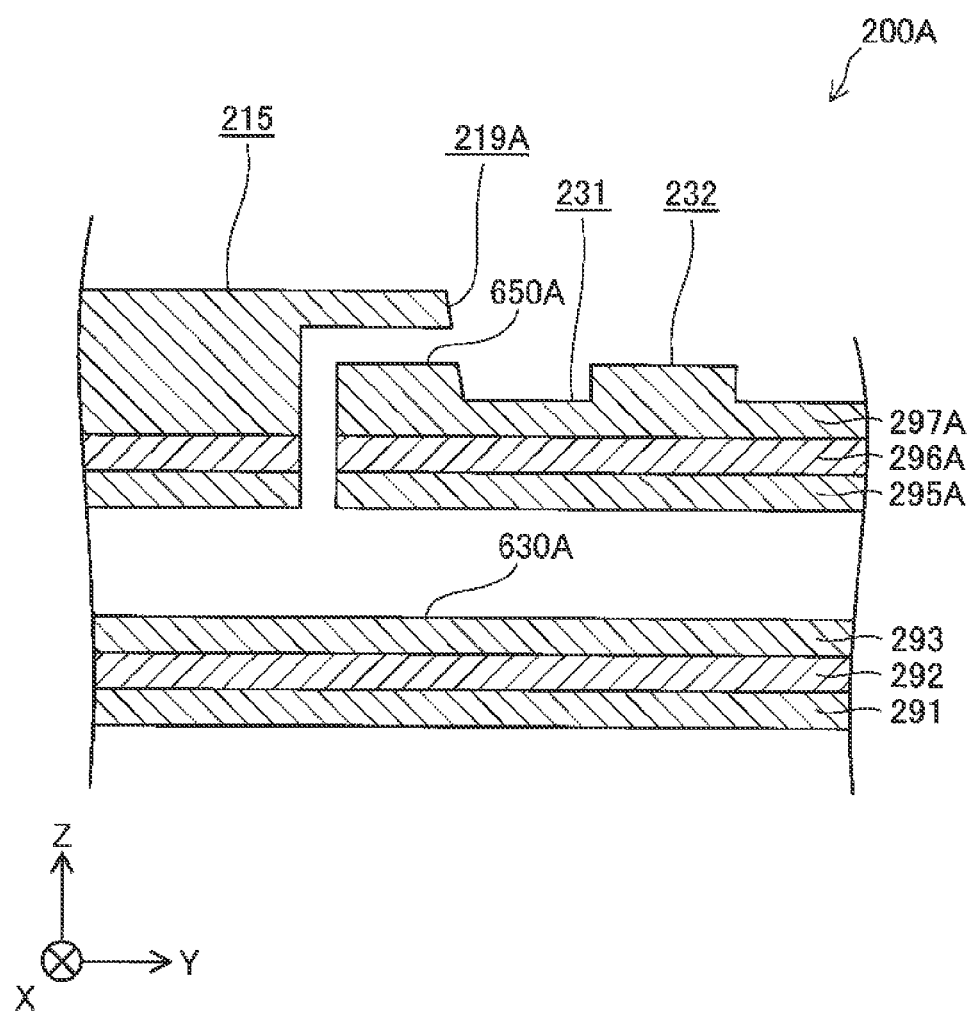
FIG. 12B is a diagram illustrating a partial cross section of the ceramic member according to the second embodiment.

FIG. 12A is a diagram illustrating an upper surface of a ceramic member 200A according to the second embodiment. FIG. 12B is a diagram illustrating a partial cross section of the ceramic member 200A according to the second embodiment. The ceramic member 200A of the second embodiment is similar to the ceramic member 200 of the first embodiment, except that gas release holes 650A are formed in a base end stepped surface 219A. The base end stepped surface 219A of the second embodiment is formed between the base end upper surface 215 and the opposed surface 231 and corresponds to the base end stepped surface 219 of the first embodiment.

The gas release holes 650A of the second embodiment are configured to communicate with a gas communication passage 630A and release the process gas. According to this embodiment, as shown in FIG. 12B, the gas release holes 650A are formed from the gas communication passage 630A through ceramic layers 295A and 296A along the Z-axis direction and pass through from inside of a ceramic layer 297A along the layer surface direction to the base end stepped surface 219A.

According to this embodiment, as shown in FIG. 12A, the gas release holes 650A are arranged to pass through the base end stepped surface 219A in a direction along the outer periphery of the opposed surface 231. According to another embodiment, the gas release holes 650A may be arranged to pass through the base end stepped surface 219A in a direction perpendicular to the outer periphery of the opposed surface 231.

According to this embodiment, the ceramic layers 295A, 296A and 297A are cut to form the gas release holes 650A, before integrally sintering the ceramic member 200A. The number of the gas release holes 650A is 4 according to this embodiment but may be 3 or a less number or alternatively may be 5 or a greater number according to other embodiments.

The second embodiment described above enhances the electrostatic attraction force, like the first embodiment. The gas release holes 650A are formed on the base end stepped surface 219A, so that the process gas is released from the base end stepped surface 219A, as well as from the opposed surface 233. This allows for further effective temperature control of the carried object 90. The gas release holes 650A are arranged to pass through the base end stepped surface 219A in the direction along the outer periphery of the opposed surface 231. This arrangement causes the process gas to be released along the outer periphery of the carried object 90 and allows for further effective temperature control of the carried object 90. The gas release holes 650A are located closer to the base end surface 211 than the opposed surface 231. This arrangement allows for further effective temperature control at the specific area of the carried object 90 located on the base end surface 211-side C. Third Embodiment In the description of a third embodiment, the like constituents to those of the first embodiment are shown by the like numerical symbols as those of the first embodiment. Constituents having different shapes or arrangements but corresponding to those of the first embodiment are shown by suffixing an alphabetical code "B" to the numerical symbols of the first embodiment.

Figure 13A:
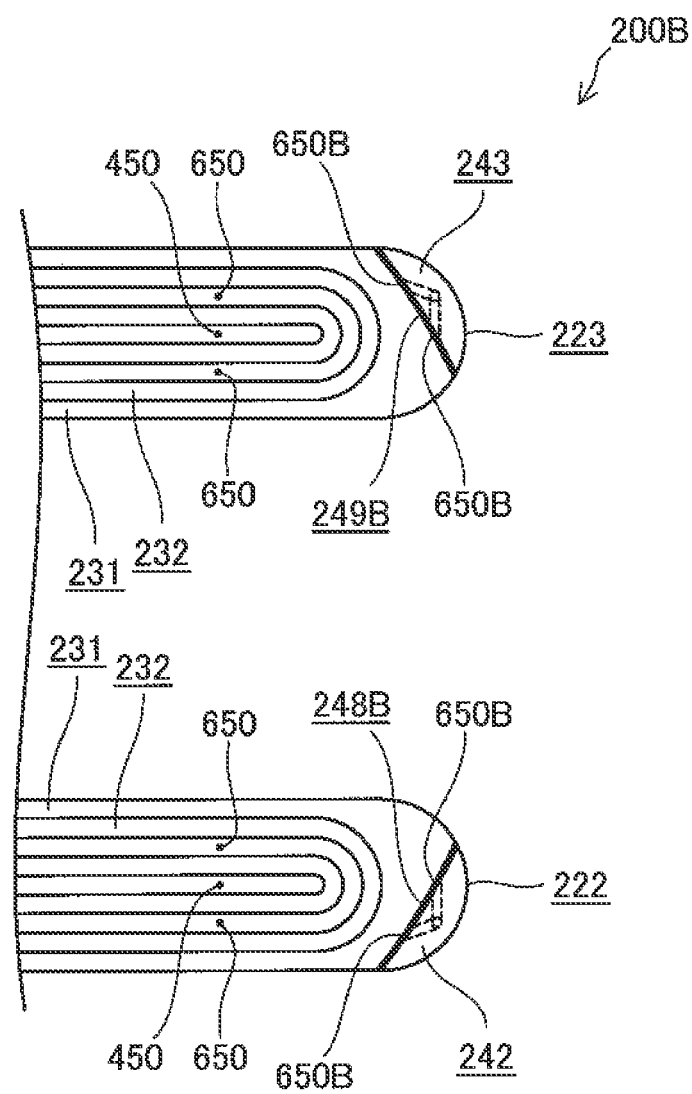
FIG. 13A is a diagram illustrating an upper surface of a ceramic member according to a third embodiment.
Figure 13B:
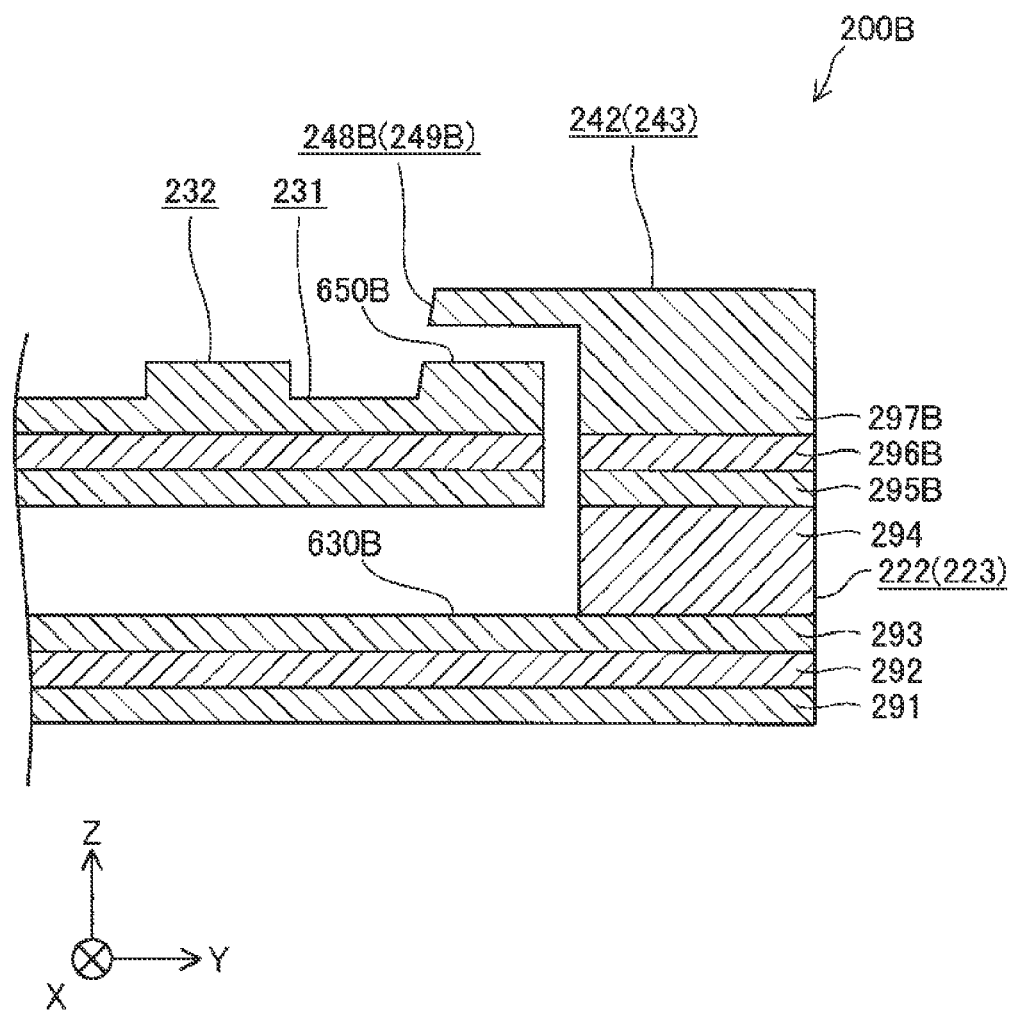
FIG. 13B is a diagram illustrating a partial cross section of the ceramic member according to the third embodiment.

FIG. 13A is a diagram illustrating an upper surface of a ceramic member 200B according to the third embodiment. FIG. 13B is a diagram illustrating a partial cross section of the ceramic member 200B according to the third embodiment. The ceramic member 200B of the third embodiment is similar to the ceramic member 200 of the first embodiment, except that gas release holes 650B are formed in open end stepped surfaces 248B and 249B.

The open end stepped surface 248B of the third embodiment is formed between the open end upper surface 242 and the opposed surface 231 and corresponds to the open end stepped surface 248 of the first embodiment. The open end stepped surface 249B of the third embodiment is formed between the open end upper surface 243 and the opposed surface 231 and corresponds to the open end stepped surface 249 of the first embodiment.

The gas release holes 650B of the third embodiment are configured to communicate with a gas communication passage 630B and release the process gas. According to this embodiment, as shown in FIG. 13B, the gas release holes 650B are formed from the gas communication passage 630B through ceramic layers 295B and 296B along the Z-axis direction and pass through from inside of a ceramic layer 297B along the layer surface direction to the open end stepped surfaces 248B and 249B.

According to this embodiment, as shown in FIG. 13A, the gas release holes 650B are arranged to pass through the open end stepped surfaces 248B and 249B in a direction along the outer periphery of the opposed surface 231. According to another embodiment, the gas release holes 650B may be arranged to pass through the open end stepped surfaces 248B and 249B in a direction perpendicular to the outer periphery of the opposed surface 231.

According to this embodiment, the ceramic layers 295B, 296B and 297B are cut to form the gas release holes 650B, before integrally sintering the ceramic member 200B. The number of the gas release holes 650B is 2 in both the open end stepped surfaces 248B and 249B according to this embodiment but may be 1 in both the open end stepped surfaces 248B and 249B or may be 3 or a greater number in both the open end stepped surfaces 248B and 249B.

The third embodiment described above enhances the electrostatic attraction force, like the first embodiment. The gas release holes 650B are formed on the open end stepped surfaces 248B and 249B, so that the process gas is released from the open end stepped surfaces 248B and 249B, as well as from the opposed surface 233. This allows for further effective temperature control of the carried object 90. The gas release holes 650B are arranged to pass through the open end stepped surfaces 248B and 249B in the direction along the outer periphery of the opposed surface 231. This arrangement causes the process gas to be released along the outer periphery of the carried object 90 and allows for further effective temperature control of the carrier objet 90. The gas release holes 650B are located closer to the open end surfaces 222 and 223 than the opposed surface 231. This arrangement allows for further effective temperature control at the specific areas of the carrier objet 90 located on the open end surface 222-side and the open end surface 223-side.

D. Fourth Embodiment

In the description of a fourth embodiment, the like constituents to those of the first embodiment are shown by the like numerical symbols as those of the first embodiment. Constituents having different shapes or arrangements but corresponding to those of the first embodiment are shown by suffixing an alphabetical code "C" to the numerical symbols of the first embodiment.

FIG. 14 is a diagram illustrating a cross section of a ceramic member 200C according to the fourth embodiment. FIG. 14 illustrates the cross section of the ceramic member 200C viewed from the position corresponding to the arrow F4-F4 in FIG. 2. The ceramic member 200C of the fourth embodiment is similar to the ceramic member 200 of the first embodiment, except that gas release holes 650C are additionally formed in outer surfaces 224C and 225C and inner surfaces 226C and 227C.

The outer surface 224C of the fourth embodiment is formed between the open end surface 222 and the base end side surface 213 and corresponds to the outer surface 224 of the first embodiment. The outer surface 225C of the fourth embodiment is formed between the open end surface 223 and the base end side surface 214 and corresponds to the outer surface 225 of the first embodiment.

The inner surface 226C of the fourth embodiment is formed between the open end surface 222 and the inner surface 221 and corresponds to the inner surface 226 of the first embodiment. The inner surface 227C of the fourth embodiment is formed between the open end surface 223 and the inner surface 221 ad corresponds to the inner surface 227 of the first embodiment.

The gas release holes 650C of the fourth embodiment are configured to communicate with a gas communication passage 630C and release the process gas. According to this embodiment, as shown in FIG. 14, the gas release holes 650C are arranged to pass through from the gas communication passage 630C along the layer surface direction to the outer surfaces 224C and 225C and the inner surfaces 226C and 227C.

According to this embodiment, the gas release holes 650C are arranged to pass through the outer surfaces 224C and 225C and the inner surfaces 226C and 227C in a direction perpendicular to the outer surfaces 224C and 225C and the inner surfaces 226C and 227C. According to another embodiment, the gas release holes 650C may be arranged to pass through the outer surfaces 224C and 225C and the inner surfaces 226C and 227C in a direction along the outer shape of the carried object 90.

According to this embodiment, the ceramic layer 294C is cut to form the gas release holes 650C, before integrally sintering the ceramic member 200C. A plurality of the gas release holes 650C are formed in each of the outer surfaces 224C and 225C and the inner surfaces 226C and 227C according to this embodiment. Only one gas release hole 650C may alternatively be formed in each of the outer surfaces 224C and 225C and the inner surfaces 226C and 227C.

The fourth embodiment described above enhances the electrostatic attraction force, like the first embodiment. The gas release holes 650C are formed in the outer surfaces 224C and 225C and in the inner surfaces 226C and 227C, so that the process gas is released from the outer surfaces 224C and 225C and the inner surfaces 226C and 227C, as well as from the opposed surface 233. This allows for further effective temperature control of the carried object 90. The arrangement of the gas release holes 650C in the outer surfaces 224C and 225C and in the inner surfaces 226C and 227C allows for further effective temperature control at the specific areas of the carried object 90 located in the vicinities of the outer surfaces 224C and 225C and the inner surfaces 226C and 227C.

According to the fourth embodiment, the gas release holes 650C are formed in both the outer surfaces 224C and 225C and the inner surfaces 226C and 227C. According to other embodiments, the gas release holes 650C may be formed only in the outer surfaces 224C and 225C or alternatively may be formed only in the inner surfaces 226C and 227C. The gas release holes 650C are not formed in the inner surface 221 according to the fourth embodiment but may be formed in the inner surface 221 according to another embodiment.

E. Fifth Embodiment

In the description of a fifth embodiment, the like constituents to those of the first embodiment are shown by the like numerical symbols as those of the first embodiment. Constituents having different shapes or arrangements but corresponding to those of the first embodiment are shown by suffixing an alphabetical code "D" to the numerical symbols of the first embodiment.

Figure 16:
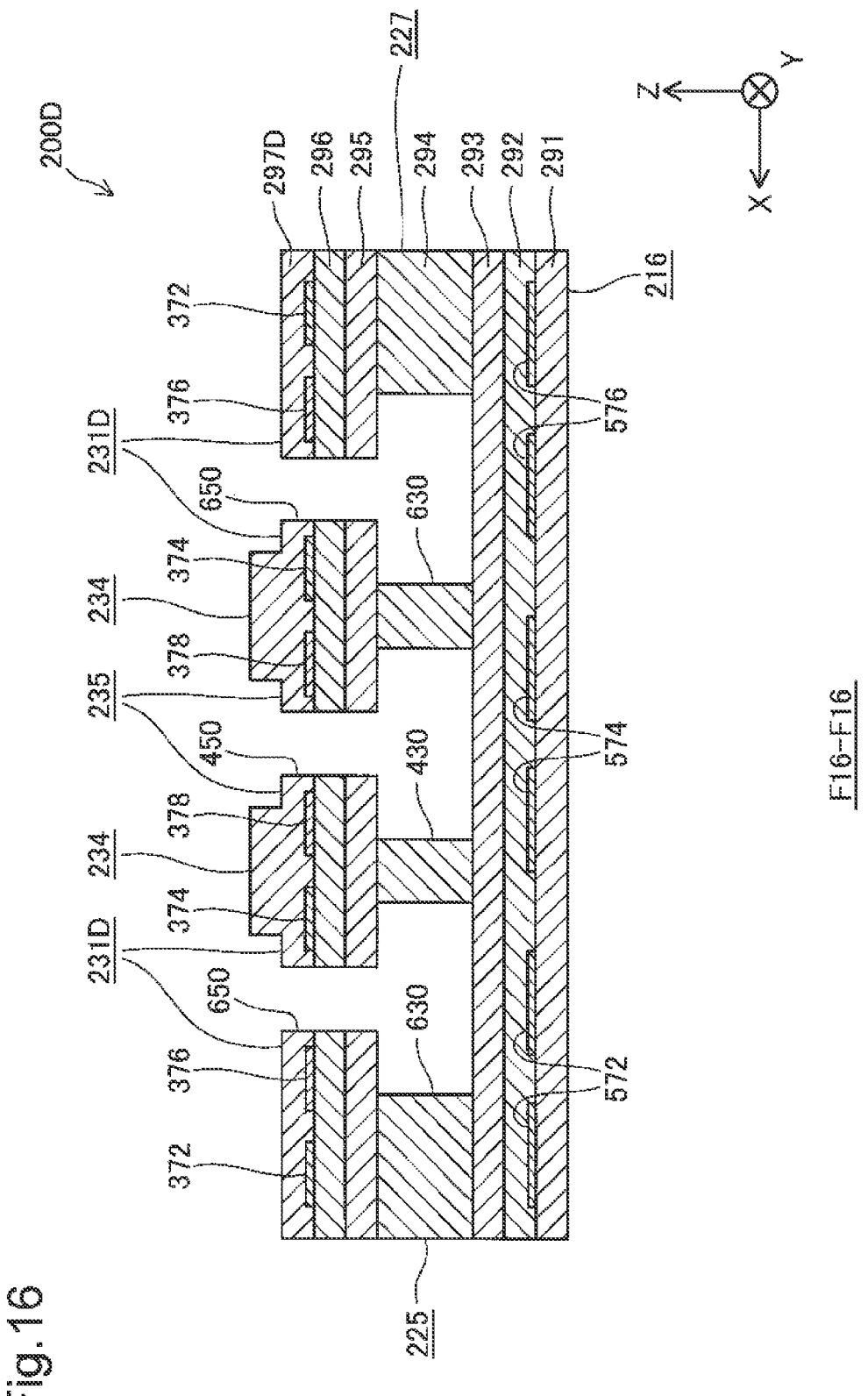
FIG. 16 is a diagram illustrating a cross section of the ceramic member taken on an arrow F16-F16 in FIG. 15.

FIG. 15 is a diagram illustrating an upper surface of a ceramic member 200D according to a fifth embodiment. FIG. 16 is a diagram illustrating a cross section of the ceramic member 200D taken on an arrow F16-F16 in FIG. 15. The ceramic member 200D of the fifth embodiment is similar to the ceramic member 200 of the first embodiment, except that the opposed surfaces 231, 232 and 233 and the open end upper surfaces 242 and 243 are replaced with an opposed surface 231D and that the process gas supplied from the process gas supplier 860 is cooling gas for cooling the carried object 90.

The opposed surface 231D has a specific shape formed by cutting the opposed surface 232 and the open end upper surfaces 242 and 243 of the first embodiment to the positions of the opposed surfaces 231 and 233 and accordingly includes a surface corresponding to the opposed surfaces 231 and 233 of the first embodiment. The opposed surface 231D is located in the −Z-axis direction of the opposed surface 231 and is arranged to surround the outer periphery of the opposed surface 234. The opposed surface 231D is connected with the base end stepped surface 219, the open end surfaces 222 and 223, the outer surfaces 224 and 225 and the inner surfaces 221, 226 and 227. The gas release holes 650 are formed in the opposed surface 231D in the same arrangement as that of the first embodiment.

The process gas supplier 860 of the fifth embodiment supplies the sufficiently cooled process gas as cooling gas to the ceramic member 200D. The cooling gas supplied from the process gas supplier 860 may be any gas that does not damage or contaminate the carried object 90. The cooling gas used is nitrogen ($N_2$) according to this embodiment but may be another inert gas such as argon (Ar) or carbon dioxide ($CO_2$) according to other embodiments.

The fifth embodiment described above enhances the electrostatic attraction force, like the first embodiment. The carried object 90 is cooled by releasing the cooling gas (process gas) through the gas release holes 650 toward the opposed surface 231D. This arrangement allows for effective temperature control of the carried object 90, while providing the electrostatic attraction. As a result, this shortens the time required for temperature control of the carried object 90 and thereby improves the transport capacity of the carrier device 10.

At least one of the gas release holes 650A of the second embodiment, the gas release holes 650B of the third embodiment and the gas release holes 650C of the fourth embodiment may be applied to the ceramic member 200D of the fifth embodiment. This allows for further effective temperature control of the carried object 90.

F. Sixth Embodiment

In the description of a sixth embodiment, the like constituents to those of the first embodiment are shown by the like numerical symbols as those of the first embodiment. Constituents having different shapes or arrangements but corresponding to those of the first embodiment are shown by suffixing an alphabetical code "E" to the numerical symbols of the first embodiment.

Figure 17:
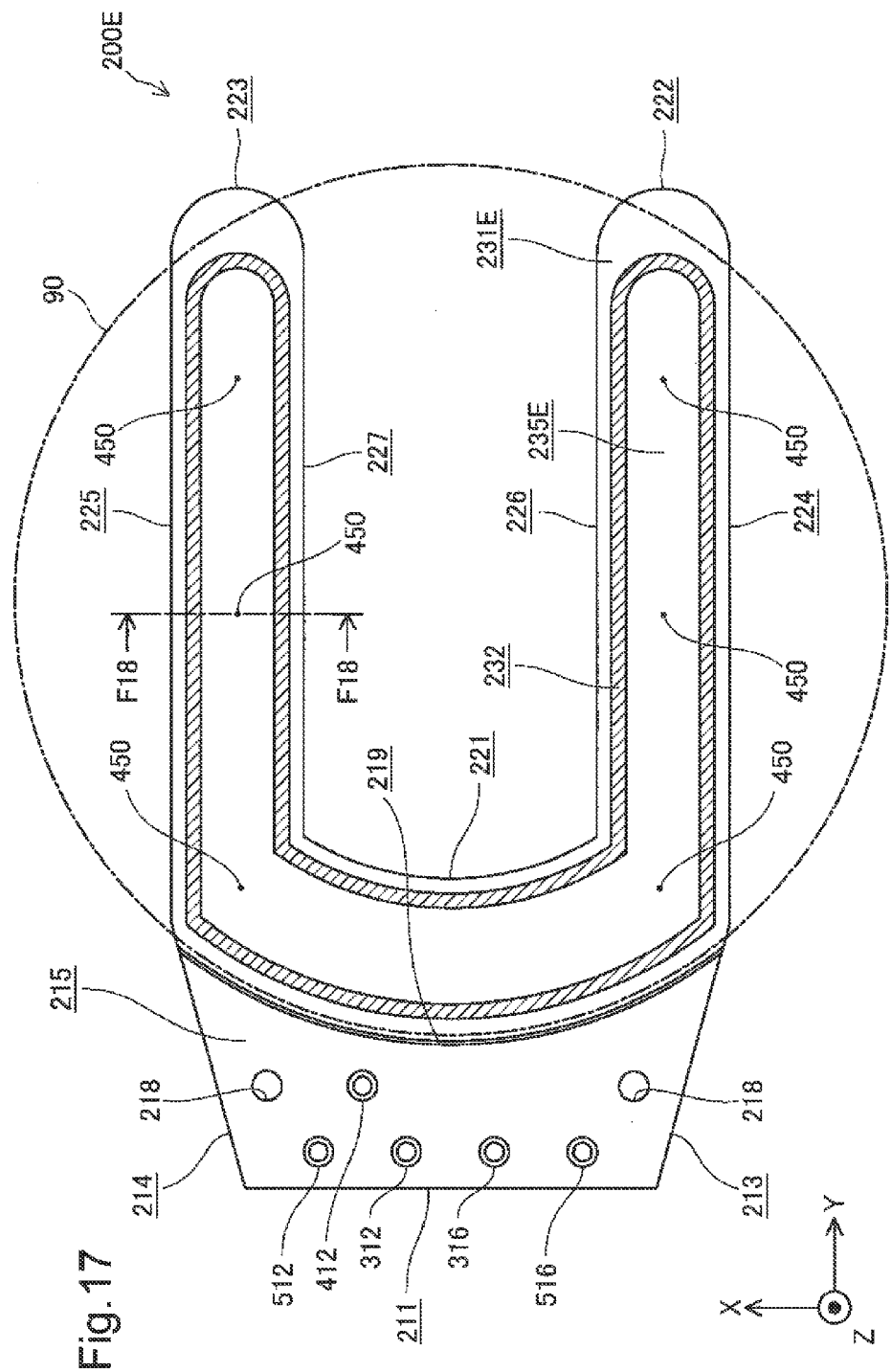
FIG. 17 is a diagram illustrating an upper surface of a ceramic member according to a sixth embodiment.
Figure 18:
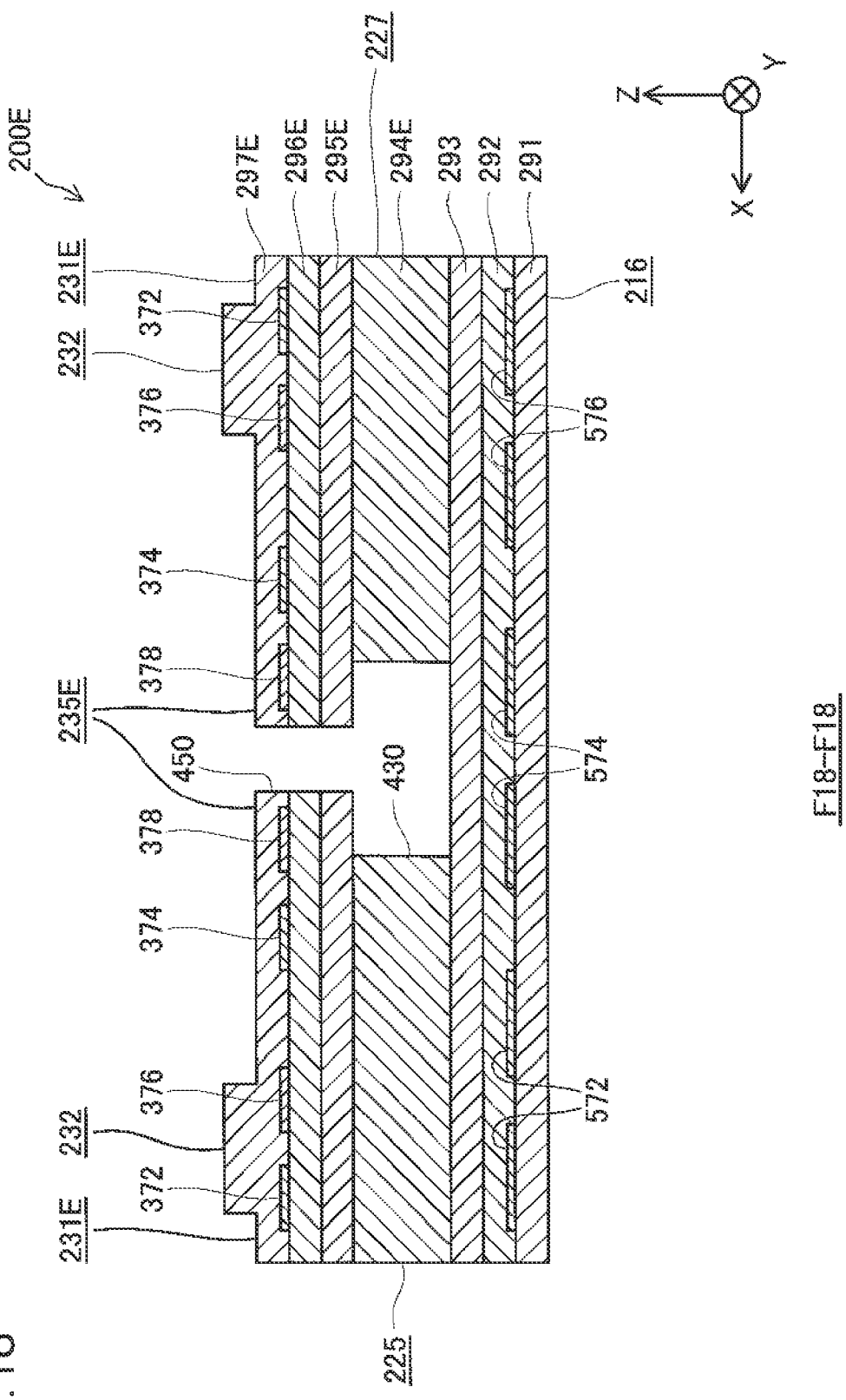
FIG. 18 is a diagram illustrating a cross section of the ceramic member taken on an arrow F18-F18 in FIG. 17.

FIG. 17 is a diagram illustrating an upper surface of a ceramic member 200E according to the sixth embodiment. FIG. 18 is a diagram illustrating a cross section of the ceramic member 200E taken on an arrow F18-F18 in FIG. 17. The ceramic member 200E of the sixth embodiment is similar to the ceramic member 200 of the first embodiment, except that the opposed surfaces 231, 233, 234 and 235 and the open end upper surfaces 242 and 243 are replaced by opposed surfaces 231E and 235E and that the structure for releasing the process gas is omitted.

The opposed surface 231E of the sixth embodiment has a specific shape formed by cutting the open end upper surfaces 242 and 243 of the first embodiment to the position of the opposed surface 231 and accordingly includes a surface corresponding to the opposed surface 231 of the first embodiment. The opposed surface 231E is located in the −Z-axis direction of the opposed surface 232 and is arranged to surround the outer periphery of the opposed surface 232. The opposed surface 231E is connected with the base end stepped surface 219, the open end surfaces 222 and 223, the outer surfaces 224 and 225 and the inner surfaces 221, 226 and 227.

The opposed surface 235E of the sixth embodiment has a specific shape formed by cutting the opposed surface 234 of the first embodiment to the position of the opposed surface 235 and accordingly includes a surface corresponding to the opposed surfaces 233 and 235 of the first embodiment. The opposed surface 235E is located in the −Z-axis direction of the opposed surface 232, and the outer periphery of the opposed surface 235E is surrounded by the opposed surface 232. The suction holes 450 are formed in the opposed surface 235E in the same arrangement as that of the first embodiment.

The sixth embodiment described above enhances the electrostatic attraction force, like the first embodiment.

G. Seventh Embodiment

In the description of a seventh embodiment, the like constituents to those of the first embodiment are shown by the like numerical symbols as those of the first embodiment. Constituents having different shapes or arrangements but corresponding to those of the first embodiment are shown by suffixing an alphabetical code "F" to the numerical symbols of the first embodiment.

Figure 19:
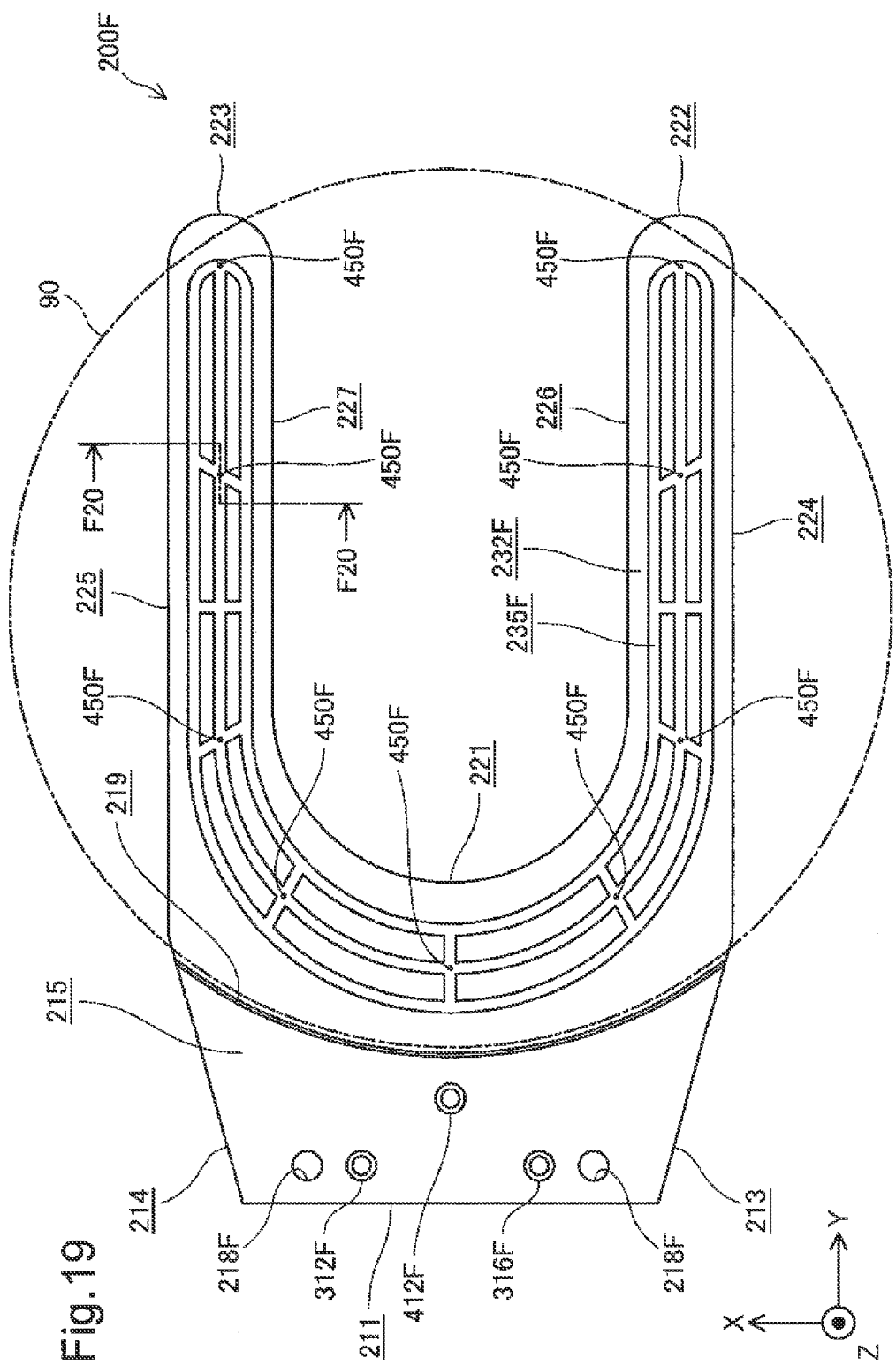
FIG. 19 is a diagram illustrating an upper surface of a ceramic member according to a seventh embodiment.
Figure 20:
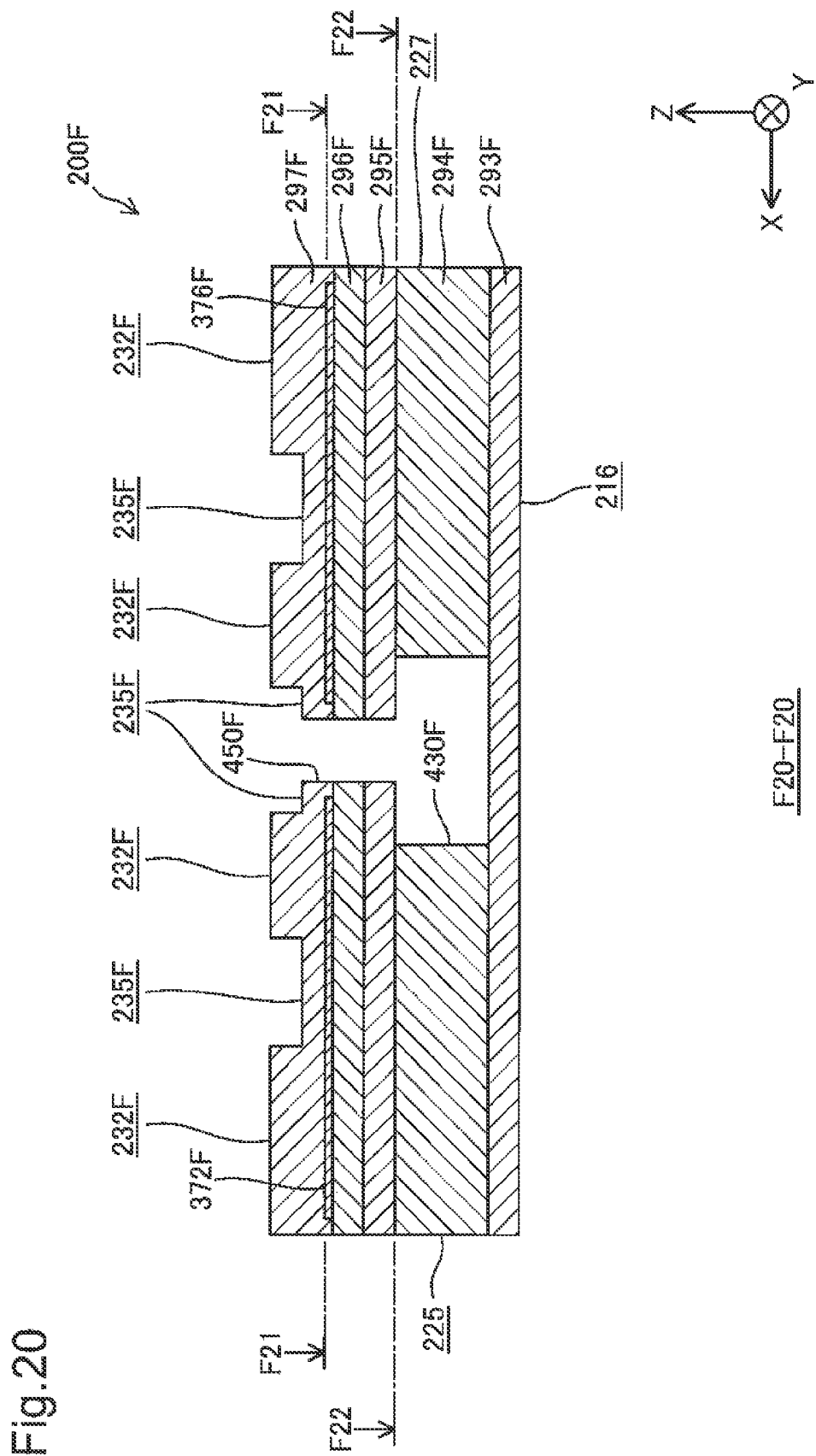
FIG. 20 is a diagram illustrating a cross section of the ceramic member taken on an arrow F20-F20 in FIG. 19.

FIG. 19 is a diagram illustrating an upper surface of a ceramic member 200F according to the seventh embodiment. FIG. 20 is a diagram illustrating a cross section of the ceramic member 200F taken on an arrow F20-F20 in FIG. 19. The ceramic member 200F of the seventh embodiment is similar to the ceramic member 200 of the first embodiment, except that the opposed surfaces 231, 232, 233, 234 and 235 and the open end upper surfaces 242 and 243 are replaced by opposed surfaces 232F and 235F, the clamping electrodes have a different shape, the negative pressure communication passage has a different shape, the structure for releasing the process gas is omitted, and the electric heating elements 572, 574 and 576 are omitted.

The opposed surfaces 232F and 235F of the seventh embodiment are surfaces that are parallel to the X axis and the Y axis and face in the +Z-axis direction. The opposed surfaces 232F and 235F are opposed to the carried object 90 in the state that the carried object 90 is held on the ceramic member 200F. The opposed surface 232F is located in the +Z-axis direction of the opposed surface 235F. The opposed surface 232F is connected with the base end stepped surface 219, the open end surfaces 222 and 223, the outer surfaces 224 and 225 and the inner surfaces 221, 226 and 227. The opposed surface 235F is located on the inner side of the opposed surface 232F and has a nearly U-shaped net-like structure.

As shown in FIG. 19, suction holes 450F are formed at the intersections of the net-like structure of the opposed surface 235F. The number of the suction holes 450F is 9 according to the seventh embodiment but may be 8 or a less number or alternatively may be 10 or a great number according to other embodiments.

As illustrated in FIG. 20, the ceramic member 200F has a plurality of ceramic layers or specifically five ceramic layers 293F, 294F, 295F, 296F and 297F. These ceramic layers are stacked in the order of the ceramic layer 293F, the ceramic layer 294F, the ceramic layer 295F, the ceramic layer 296F and the ceramic layer 297F from the bottom surface 216-side.

Figure 21:
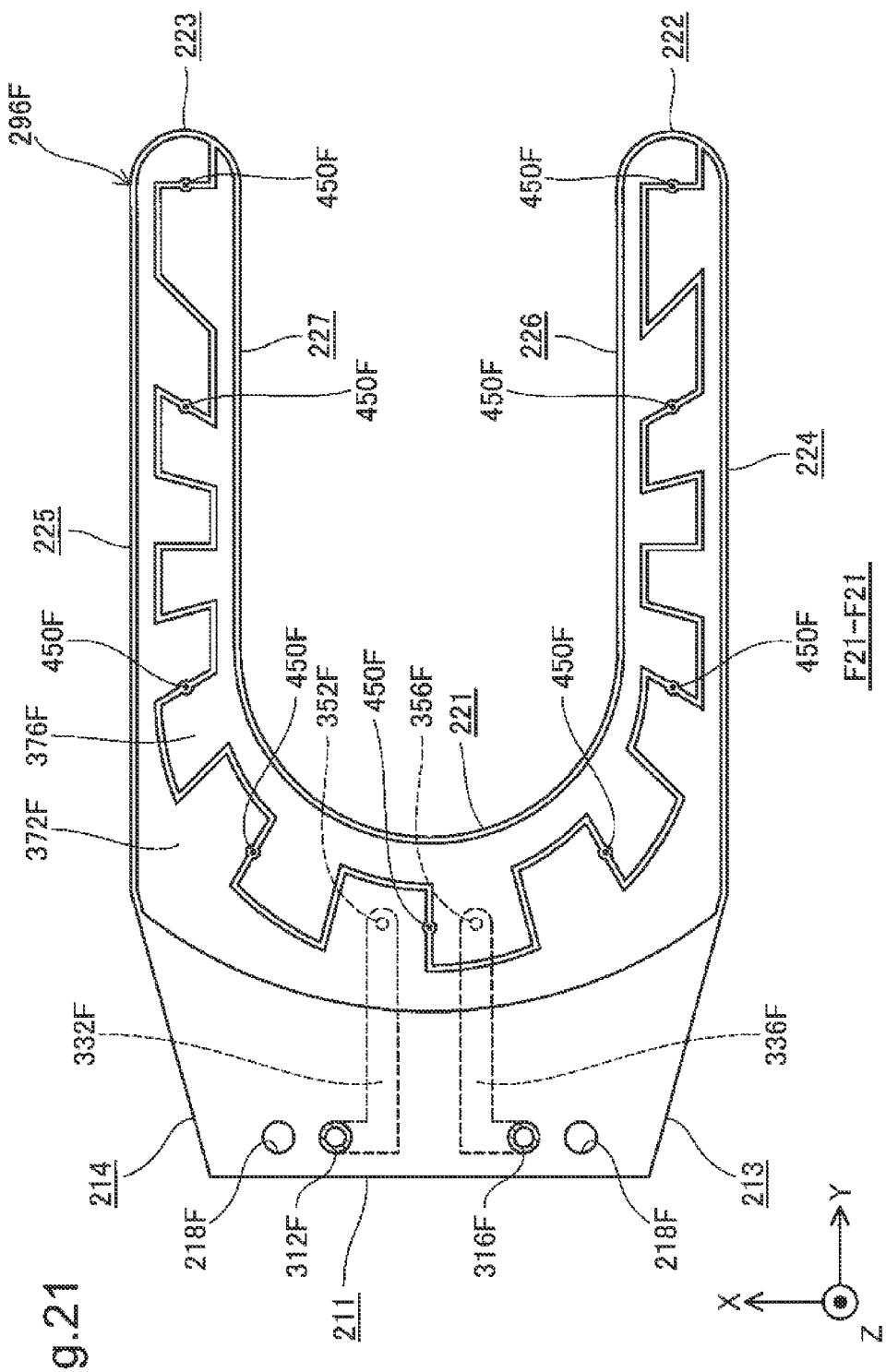
FIG. 21 is a diagram illustrating a ceramic layer viewed from the position corresponding to an arrow F21-F21 in FIG. 20.

FIG. 21 is a diagram illustrating the ceramic layer 296F viewed from the position corresponding to an arrow F21-F21 in FIG. 20. FIG. 21 illustrates the ceramic layer 296F with clamping electrodes 372F and 376F formed thereon.

The clamping electrodes 372F and 376F are configured to have potentials of different polarities. The clamping electrodes 372F and 376F are formed by avoiding the positions of the suction holes 450F. As shown in FIGS. 19, 20 and 21, the clamping electrode 372F is arranged along the outer surface 224, the based end stepped surface 219 and the outer surface 225. The clamping electrode 376F is arranged along the inner surface 226, the inner surface 221 and the inner surface 227. The clamping electrode 372F and the clamping electrode 376F are arranged such as to substantially equally overlap with the opposed surface 232F in relation to the Z-axis direction.

Figure 22:
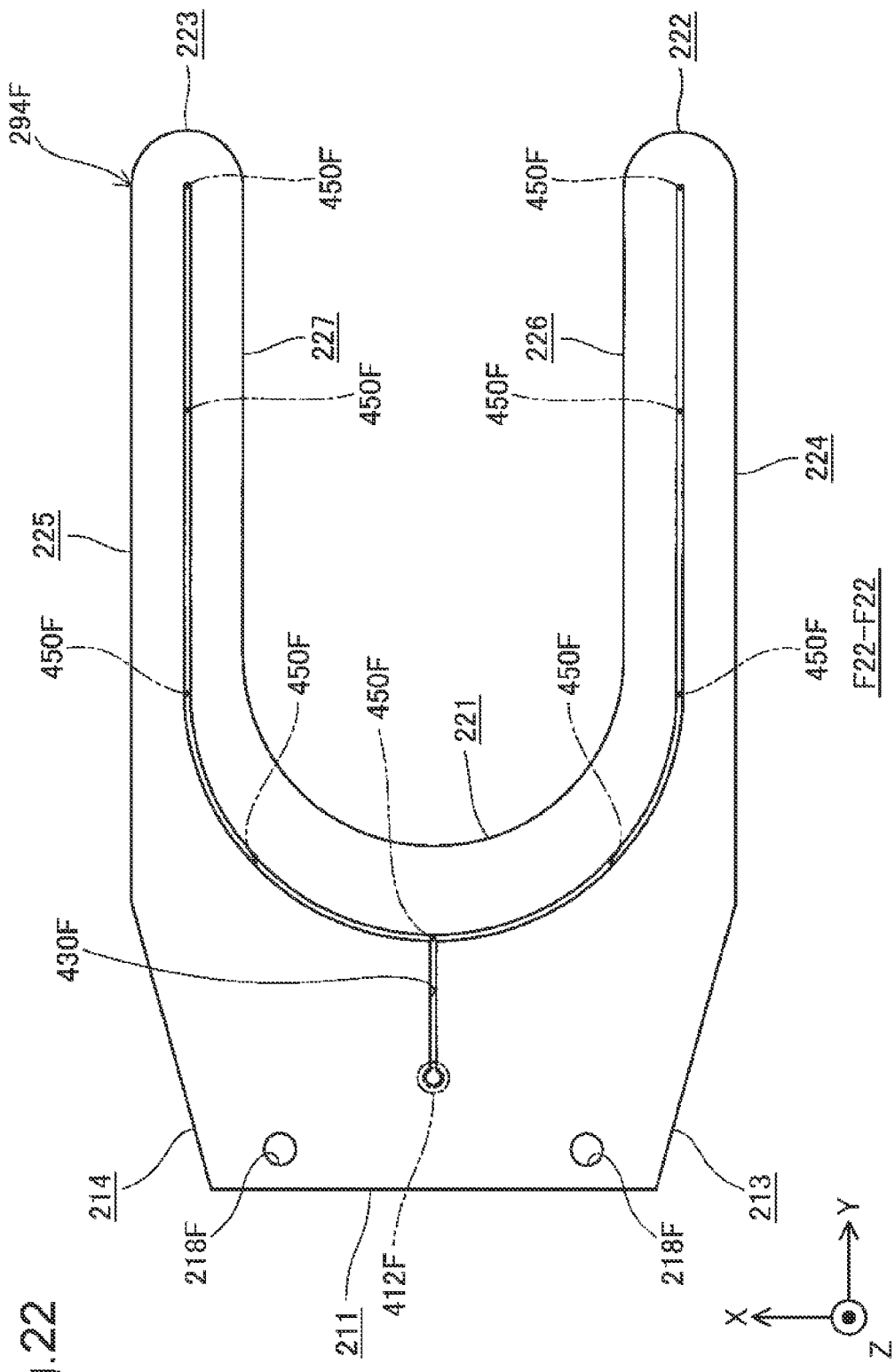
FIG. 22 is a diagram illustrating a ceramic layer viewed from the position corresponding to an arrow F22-F22 in FIG. 20.

FIG. 22 is a diagram illustrating the ceramic layer 294F viewed from the position corresponding to an arrow F22-F22 in FIG. 20. In FIG. 22, a negative pressure supply port 412F and the suction holes 450F are shown by the dot and dash line at the positions projected on the ceramic layer 294F along the Z-axis direction. A negative pressure communication passage 430F of the seventh embodiment runs from the position corresponding to the negative pressure supply port 412F toward the inner surface 221 and then branches into two flow paths toward the open end surface 222 and toward the open end surface 223 which go through the positions corresponding to the nine suction holes 450F.

In FIG. 21, lands 332F and 336F and vias 352F and 356F are shown by the broken line. The land 332F is a conductive pattern formed on the ceramic layer 295F and configured to receive electric power through a power feed port 312F. The land 336 is a conductive pattern formed on the ceramic layer 295F and configured to receive electric power through a power feed port 316F. The via 352F is a conductive material which passes through the ceramic layer 296F and electrically connects the land 332F with the clamping electrode 372F. The via 356F is a conductive material which passes through the ceramic layer 296F and electrically connects the land 336F with the clamping electrode 376F.

The seventh embodiment described above supplies electric power through the lands 332F and 336F formed on the ceramic layer 295F and the vias 352F and 356F to the clamping electrodes 372F and 376F formed on the ceramic layer 296F. This improves the flexibility of the arrangement and the shape of the clamping electrodes 372F and 376F on the ceramic layer 296F. As a result, this enhances the electrostatic attraction force and thereby improves the transport capacity of the carrier device 10.

H. Eighth Embodiment

In the description of an eighth embodiment, the like constituents to those of the first embodiment are shown by the like numerical symbols as those of the first embodiment. Constituents having different shapes or arrangements but corresponding to those of the first embodiment are shown by suffixing an alphabetical code "G" to the numerical symbols of the first embodiment.

Figure 23:
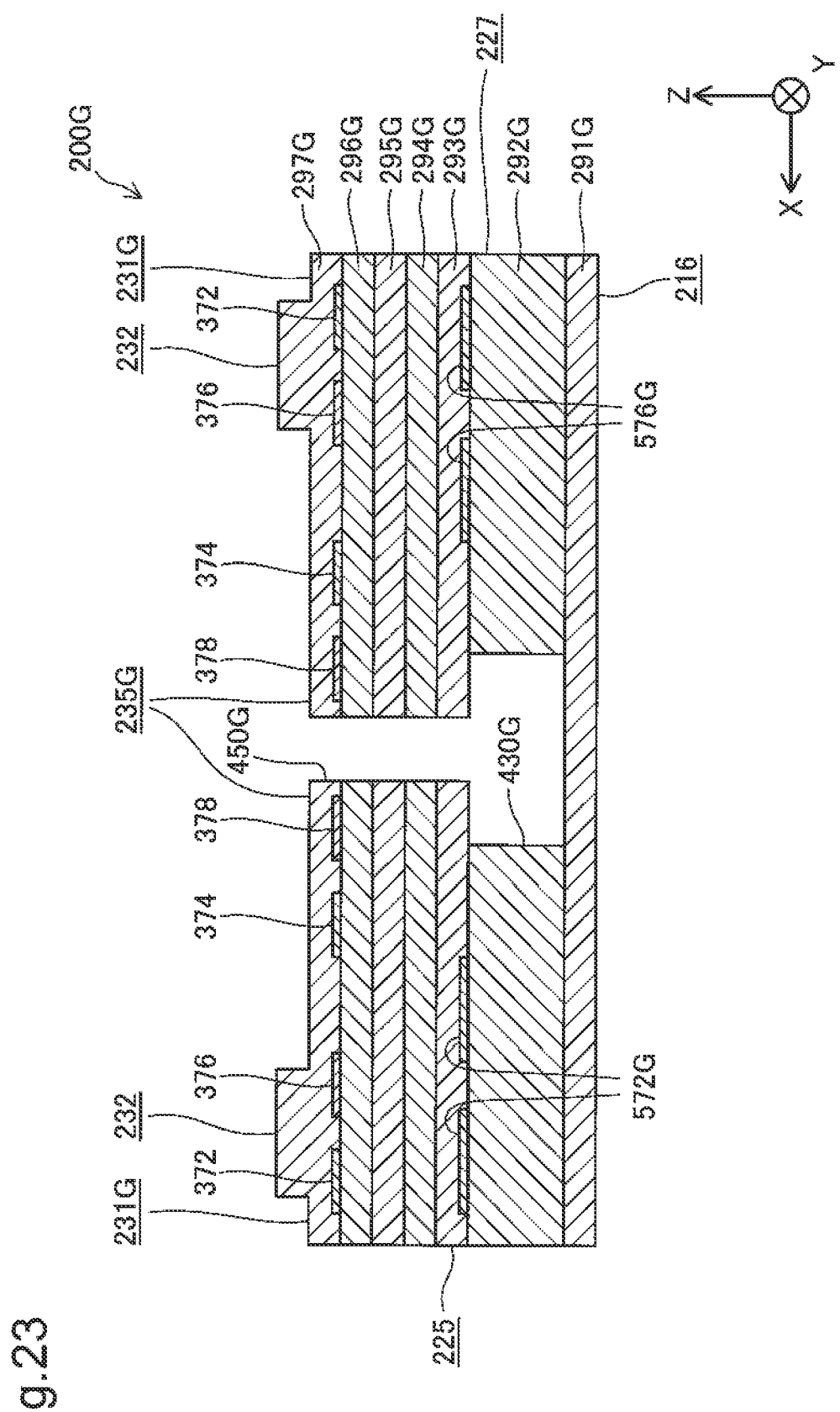
FIG. 23 is a diagram illustrating a cross section of a ceramic member according to an eighth embodiment.

FIG. 23 is a diagram illustrating a cross section of a ceramic member 200G according to the eighth embodiment. The upper surface of the ceramic member 200G of the eighth embodiment is similar to the upper surface of the ceramic member 200E of the sixth embodiment shown in FIG. 17. FIG. 23 illustrates the cross section of the ceramic member 200G viewed from the position corresponding to the arrow F18-F18 in FIG. 17.

The ceramic member 200G of the eighth embodiment is similar to the ceramic member of the sixth embodiment, except that electric heating elements 572G and 576G are formed in the +Z-axis direction of a negative pressure communication passage 430G. In the eighth embodiment, the negative pressure communication passage 430G is formed in a ceramic layer 292G, and the electric heating elements 572G and 576G are formed between ceramic layers 292G and 293G.

The eighth embodiment described above enhances the electrostatic attraction force, like the first embodiment. This arrangement avoids thermal insulation between the electric heating elements 572G and 576G and the carried object 90 by the negative pressure communication passage 430G and thereby allows for further effective temperature control by the electric heating elements 572G and 576G.

I. Ninth Embodiment

In the description of a ninth embodiment, the like constituents to those of the first embodiment are shown by the like numerical symbols as those of the first embodiment. Constituents having different shapes or arrangements but corresponding to those of the first embodiment are shown by suffixing an alphabetical code "H" to the numerical symbols of the first embodiment.

Figure 24:
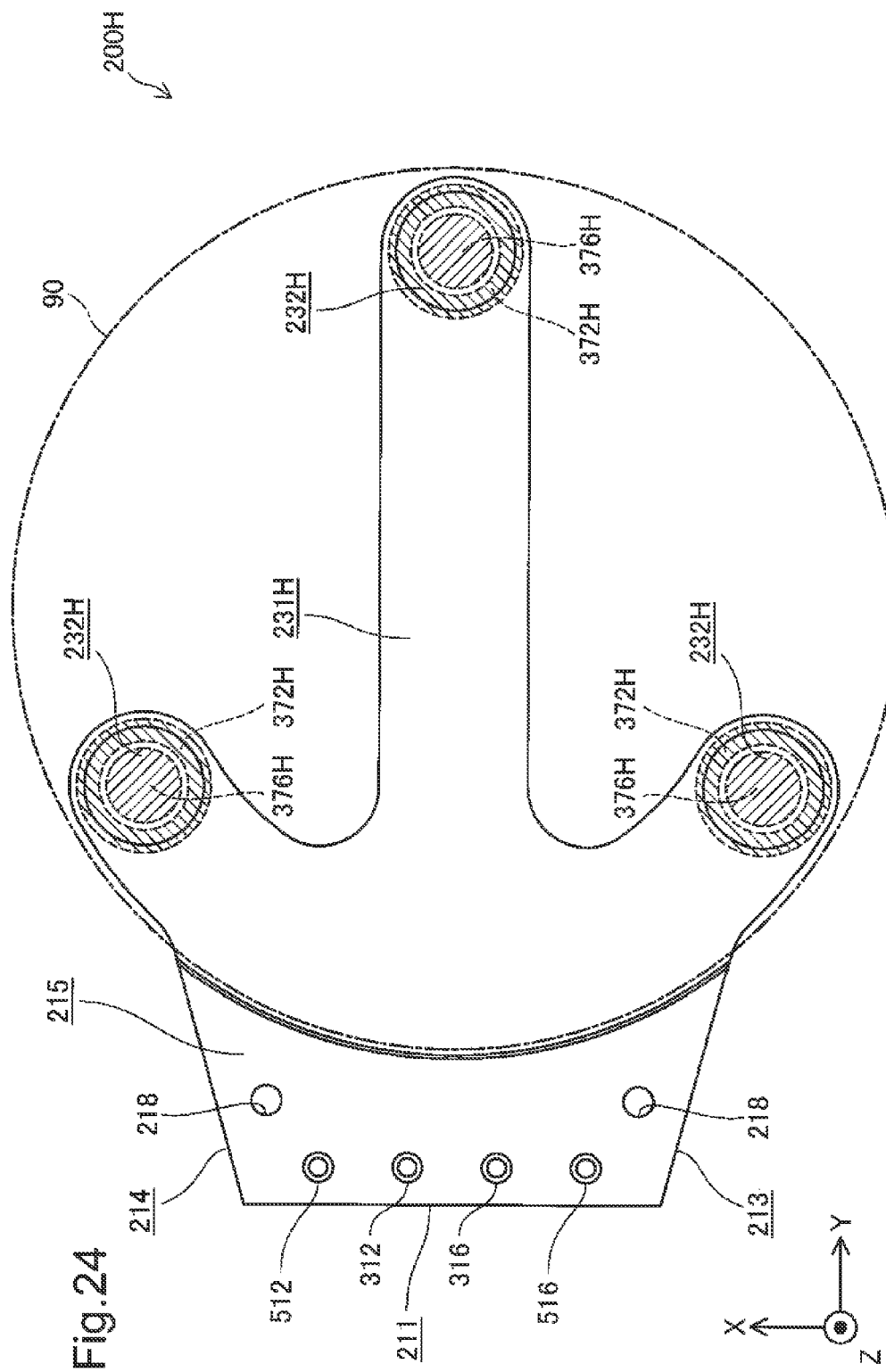
FIG. 24 is a diagram illustrating an upper surface of a ceramic member according to a ninth embodiment.

FIG. 24 is a diagram illustrating an upper surface of a ceramic member 200H according to the ninth embodiment. The ceramic member 200H of the ninth embodiment is similar to the ceramic member 200 of the first embodiment, except that the ceramic member 200H has a three-way plate-like shape extending in three directions, opposed surfaces and clamping electrodes have different shapes and the structure for negative pressure suction and the structure for releasing the process gas are omitted.

The ceramic member 200H has an opposed surface 231H extending in three directions. Opposed surfaces 232H in a circular shape in relation to the Z-axis direction are respectively arranged in the vicinity of three open ends of the opposed surface 231H. The opposed surfaces 232H are located in the +Z-axis direction of the opposed surface 231H.

Clamping electrodes 372H and 376H are formed inside of the ceramic member 200H corresponding to each of the three opposed surfaces 232H. The clamping electrodes 372H and 376H are configured to have potentials of different polarities. In relation to the Z-axis direction, the clamping electrode 372H is formed in a ring shape having the inner periphery that is greater than the outer periphery of the clamping electrode 376H and the outer periphery that is greater than the outer periphery of the opposed surface 232H. The clamping electrode 376H is formed in a circular shape that is smaller than the outer periphery of the opposed surface 232H. In relation to the Z-axis direction, the opposed surface 232H, the clamping electrode 372H and the clamping electrode 376H have an identical center of the respective circular arcs. The clamping electrode 372H and the clamping electrode 376H are arranged to substantially equally overlap with the opposed surface 232H in relation to the Z-axis direction.

The ninth embodiment described above enhances the electrostatic attraction force, like the first embodiment.

J. Tenth Embodiment

In the description of a tenth embodiment, the like constituents to those of the first embodiment are shown by the like numerical symbols as those of the first embodiment. Constituents having different shapes or arrangements but corresponding to those of the first embodiment are shown by suffixing an alphabetical code "I" to the numerical symbols of the first embodiment.

FIG. 25 is a diagram illustrating an upper surface of a ceramic member 200I according to the tenth embodiment. The ceramic member 200I of the tenth embodiment is similar to the ceramic member 200H of the ninth embodiment, except that clamping electrodes have a different shape.

The ceramic member 200I has an opposed surface 231I extending in three directions. Opposed surfaces 232I in a circular shape in relation to the Z-axis direction are respectively arranged in the vicinity of three open ends of the opposed surface 231I. The opposed surfaces 232I are located in the +Z-axis direction of the opposed surface 231I.

Clamping electrodes 372I and 376I are formed inside of the ceramic member 200I corresponding to each of the three opposed surfaces 232I. The clamping electrodes 372I and 376I are configured to have potentials of different polarities. In relation to the Z-axis direction, the clamping electrode 372I has a semicircular outer periphery that is greater than the outer periphery of the opposed surface 232I. The clamping electrode 376I has a semicircular outer periphery that is line symmetrical to the clamping electrode 372I. In relation to the Z-axis direction, the opposed surface 232I, the clamping electrode 372I and the clamping electrode 376I have an identical center of the respective circular arcs. The clamping electrode 372I and the clamping electrode 376I are arranged to substantially equally overlap with the opposed surface 232I in relation to the Z-axis direction.

The tenth embodiment described above enhances the electrostatic attraction force, like the first embodiment.

K. Eleventh Embodiment

In the description of an eleventh embodiment, the like constituents to those of the first embodiment are shown by the like numerical symbols as those of the first embodiment. Constituents having different shapes or arrangements but corresponding to those of the first embodiment are shown by suffixing an alphabetical code "J" to the numerical symbols of the first embodiment.

FIG. 26 is a diagram illustrating an upper surface of a ceramic member 200J according to the eleventh embodiment. The ceramic member 200J of the eleventh embodiment is similar to the ceramic member 200H of the ninth embodiment, except that clamping electrodes have a different shape.

The ceramic member 200J has an opposed surface 231J extending in three directions. Opposed surfaces 232J in a circular shape in relation to the Z-axis direction are respectively arranged in the vicinity of three open ends of the opposed surface 231J. The opposed surfaces 232J are located in the +Z-axis direction of the opposed surface 231J.

Clamping electrodes 372J and 376J are formed inside of the ceramic member 200J corresponding to each of the three opposed surfaces 232J. The clamping electrodes 372J and 376J are configured to have potentials of different polarities. In relation to the Z-axis direction, the clamping electrode 372J and the clamping electrode 376J are formed in comb-like shapes to engage with each other. The clamping electrode 372J and the clamping electrode 376J are arranged to substantially equally overlap with the opposed surface 232J in relation to the Z-axis direction.

The eleventh embodiment described above enhances the electrostatic attraction force, like the first embodiment.

L. Other Embodiments

The foregoing describes some embodiments of the invention. The invention is, however, not limited to these embodiments, but a multiplicity of variations and modifications may be made to the embodiments without departing from the scope of the invention.

The overall geometry of the ceramic member is not limited to the nearly U-shaped plate-like form or the three-way plate-like form extending in the three directions but may be any of various other shapes including circular, triangular, rectangular and polygonal. The shape, the arrangement and the number of the opposed surfaces, the clamping electrodes, the negative pressure communication passage, the suction holes, the electric heating elements, the lands, the vias, the gas communication passage and the gas release holes are not limited to those described in the above embodiment but may be adequately changed according to other embodiments.

The carrier device 10 may be provided as a device constituting part of a liquid crystal substrate manufacturing system of manufacturing a liquid crystal substrate using a glass substrate, and the carried object 90 may be the glass substrate. The carrier device 10 may be provided as a device constituting part of a plasma substrate manufacturing system of manufacturing a plasma substrate using a glass substrate, and the carried object 90 may be the glass substrate. The carrier device 10 may be provided as a device constituting part of a solar cell manufacturing system of manufacturing a solar cell substrate using an amorphous silicon wafer, and the carried object 90 may be the amorphous silicon wafer.

REFERENCE SIGNS LIST

10 Carrier device
90 Carried object
100 Controller
200, 200A-200J Ceramic member
211 Base end surface
213 Base end side surface
214 Base end side surface
215 Base end upper surface
216 Bottom surface
218 Through holes
219, 219A Base end stepped surface
221 Inner surface
222 Open end surface
223 Open end surface
224, 224C Outer surface
225, 225C Outer surface
226, 226C Inner surface
227, 227C Inner surface
231, 231D, 231E, 231H, 231I, 231J Opposed surface
232, 232F, 232H, 232I, 232J Opposed surface
233 Opposed surface
234 Opposed surface
235, 235E, 235F Opposed surface
242 Open end upper surface
243 Open end upper surface
248, 248B Open end stepped surface
249, 249B Open end stepped surface
291 to 297 Ceramic layers
312, 312F Power feed port
316, 316F Power feed port
332, 336 Lands
352, 354, 356, 358 Vias
372, 372F, 372H, 372I, 372J Clamping electrode
374 Clamping electrode
376, 376F, 376H, 376I, 376J Clamping electrode
378 Clamping electrode
412, 412F Negative pressure supply port
430, 430F, 430G Negative pressure communication passage
450, 450F Suction holes
512 Power feed port
516 Power feed port
532, 536 Lands
552, 553, 554, 556, 557, 558 Vias
572, 572G Electric heating element
574 Electric heating element
576 Electric heating element
612 Gas supply port
630, 630A, 630B, 630C Gas communication passage
650, 650A, 650B, 650C Gas release holes
710 Arm mechanism
720 Transfer mechanism
830 Clamping electrode driver
840 Negative pressure supplier
850 Electrothermic driver
860 Process gas supplier

What is claimed is:

1. A ceramic member configured to be movable along with a carried object in a state of holding the carried object, in a carrier device, the ceramic member comprising:
    a plurality of ceramic layers laminated in a thickness direction of the ceramic member, the plurality of ceramic layers have insulating properties and are integrally sintered;
    a clamping electrode formed on a first ceramic layer among the plurality of ceramic layers and inside of the plurality of ceramic layers, and configured to attract a dielectric material by electrostatic force;
    a power feed port configured to receive a supply of electric power to the clamping electrode from outside of the ceramic member;
    a land formed on a second ceramic layer, which is different from the first ceramic layer among the plurality of ceramic layers, and configured to receive electric power through the power feed port; and
    a via arranged to pass through at least one of the plurality of ceramic layers and provided as a conductive material to electrically connect the clamping electrode with the land,
    said ceramic member further comprising a first opposed surface and a second opposed surface provided as uppermost surfaces along a layer surface direction of the plurality of ceramic layers and arranged to face the carried object in a state of holding the carried object,
    wherein the second opposed surface is located closer to the carried object than the first opposed surface, and at least part of the clamping electrode is arranged to overlap with the second opposed surface in the thickness direction perpendicular to the layer surface direction.

2. The ceramic member according to claim 1, wherein the clamping electrode is located closer to a side holding the carried object than the land.

3. The ceramic member according to claim 1,
    wherein the clamping electrode comprises a first electrode and a second electrode configured to have potentials of different polarities,
    wherein the first electrode and the second electrode are arranged to substantially equally overlap with the second opposed surface in the thickness direction.

4. The ceramic member according to claim 1, further comprising a suction hole formed in the first opposed surface and configured to provide a negative pressure to the first opposed surface and thereby suck the carried object,
    wherein the second opposed surface is arranged to surround the suction hole and the first opposed surface in relation to the thickness direction.

5. A carrier device configured to carry a carried object using the ceramic member according to claim 1.

6. The ceramic member according to claim 1, one or more of each of a suction hole and a gas release hole are formed in the first opposed surface.

* * * * *